United States Patent
Lim et al.

(10) Patent No.: US 10,608,091 B2
(45) Date of Patent: *Mar. 31, 2020

(54) SEMICONDUCTOR DEVICE AND METHOD FOR MANUFACTURING THE SAME

(71) Applicant: Samsung Electronics Co., Ltd., Suwon-si, Gyeonggi-do (KR)

(72) Inventors: Tae-Wan Lim, Suwon-si (KR); Hojong Kang, Cheongju-si (KR); Joowon Park, Seoul (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 0 days.

This patent is subject to a terminal disclaimer.

(21) Appl. No.: 16/121,020

(22) Filed: Sep. 4, 2018

(65) Prior Publication Data

US 2019/0019872 A1 Jan. 17, 2019

Related U.S. Application Data

(63) Continuation of application No. 15/591,736, filed on May 10, 2017, now Pat. No. 10,103,236, which is a (Continued)

(30) Foreign Application Priority Data

Dec. 10, 2014 (KR) .................. 10-2014-0177548

(51) Int. Cl.
*H01L 23/52* (2006.01)
*H01L 29/423* (2006.01)
(Continued)

(52) U.S. Cl.
CPC .... *H01L 29/4234* (2013.01); *H01L 21/76805* (2013.01); *H01L 21/76816* (2013.01); (Continued)

(58) Field of Classification Search
CPC ............... H01L 23/3171; H01L 23/485; H01L 23/5226; H01L 21/76816; H01L 21/76805;
(Continued)

(56) References Cited

U.S. PATENT DOCUMENTS

| 5,619,071 A | 4/1997 | Myers et al. |
| 6,028,363 A | 2/2000 | Lin |

(Continued)

FOREIGN PATENT DOCUMENTS

| KR | 10-2007-0008118 A | 1/2007 |
| KR | 10-2008-0060310 A | 7/2008 |

(Continued)

*Primary Examiner* — Luan C Thai
(74) *Attorney, Agent, or Firm* — Harness, Dickey & Pierce, P.L.C.

(57) ABSTRACT

A method for manufacturing a semiconductor device includes forming a conductive pattern on a substrate, forming a filling insulation layer covering the conductive pattern, forming a contact hole in the filling insulation layer and adjacent to the conductive pattern, forming an opening in the conductive pattern by removing a portion of the conductive pattern adjacent to the contact hole such that the opening is connected to the contact hole, and forming a contact plug filling the contact hole and the opening. A width of the opening is greater than a width of the contact hole.

20 Claims, 36 Drawing Sheets

Related U.S. Application Data continuation of application No. 14/956,735, filed on Dec. 2, 2015, now Pat. No. 9,711,603.

(51) Int. Cl.
    *H01L 23/31*     (2006.01)
    *H01L 27/11582*     (2017.01)
    *H01L 21/28*     (2006.01)
    *H01L 23/485*     (2006.01)
    *H01L 23/522*     (2006.01)
    *H01L 27/1157*     (2017.01)
    *H01L 27/11575*     (2017.01)
    *H01L 21/768*     (2006.01)
    *H01L 29/66*     (2006.01)
    *H01L 29/792*     (2006.01)

(52) U.S. Cl.
    CPC ........ *H01L 23/3171* (2013.01); *H01L 23/485* (2013.01); *H01L 23/5226* (2013.01); *H01L 27/1157* (2013.01); *H01L 27/11575* (2013.01); *H01L 27/11582* (2013.01); *H01L 29/40117* (2019.08); *H01L 29/66833* (2013.01); *H01L 29/7926* (2013.01); *H01L 2924/0002* (2013.01)

(58) Field of Classification Search
    CPC ........... H01L 27/11582; H01L 27/1157; H01L 27/11575; H01L 29/40117; H01L 29/4234; H01L 29/66833; H01L 29/7926
    USPC ........................................................ 257/774
See application file for complete search history.

(56) References Cited

U.S. PATENT DOCUMENTS

| | | |
|---|---|---|
| 6,271,083 B1 | 8/2001 | Lou |
| 6,455,412 B1 | 9/2002 | Liou et al. |
| 6,841,442 B1 | 1/2005 | Jin |
| 7,511,349 B2 | 3/2009 | Tsai et al. |
| 7,679,133 B2 | 3/2010 | Son et al. |
| 8,039,828 B2 | 10/2011 | Park et al. |
| 8,119,503 B2 | 2/2012 | Lee et al. |
| 8,178,917 B2 * | 5/2012 | Tanaka ............... H01L 27/115 257/324 |
| 8,304,348 B2 * | 11/2012 | Hashimoto ....... H01L 27/11582 438/618 |
| 8,409,977 B2 | 4/2013 | Shim et al. |
| 8,541,831 B2 | 9/2013 | Chae et al. |
| 8,553,466 B2 | 10/2013 | Han et al. |
| 8,559,235 B2 | 10/2013 | Yoon et al. |
| 8,654,587 B2 | 2/2014 | Yoon et al. |
| 9,373,540 B2 * | 6/2016 | Hyun ............... H01L 21/76843 |
| 9,577,085 B2 * | 2/2017 | Lee ................... H01L 27/11524 |
| 9,711,603 B2 * | 7/2017 | Lim ..................... H01L 23/485 |
| 10,103,236 B2 * | 10/2018 | Lim ..................... H01L 23/485 |
| 2002/0070457 A1 | 6/2002 | Sun et al. |
| 2007/0210348 A1 | 9/2007 | Song et al. |
| 2010/0009531 A1 | 1/2010 | Choi et al. |
| 2011/0233648 A1 | 9/2011 | Seol et al. |
| 2013/0043509 A1 | 2/2013 | Cho et al. |
| 2015/0155296 A1 | 6/2015 | Yoon |

FOREIGN PATENT DOCUMENTS

| | | |
|---|---|---|
| KR | 10-2009-0080435 A | 7/2009 |
| KR | 10-2010-0006646 A | 1/2010 |
| KR | 10-2011-0001527 A | 1/2011 |

\* cited by examiner

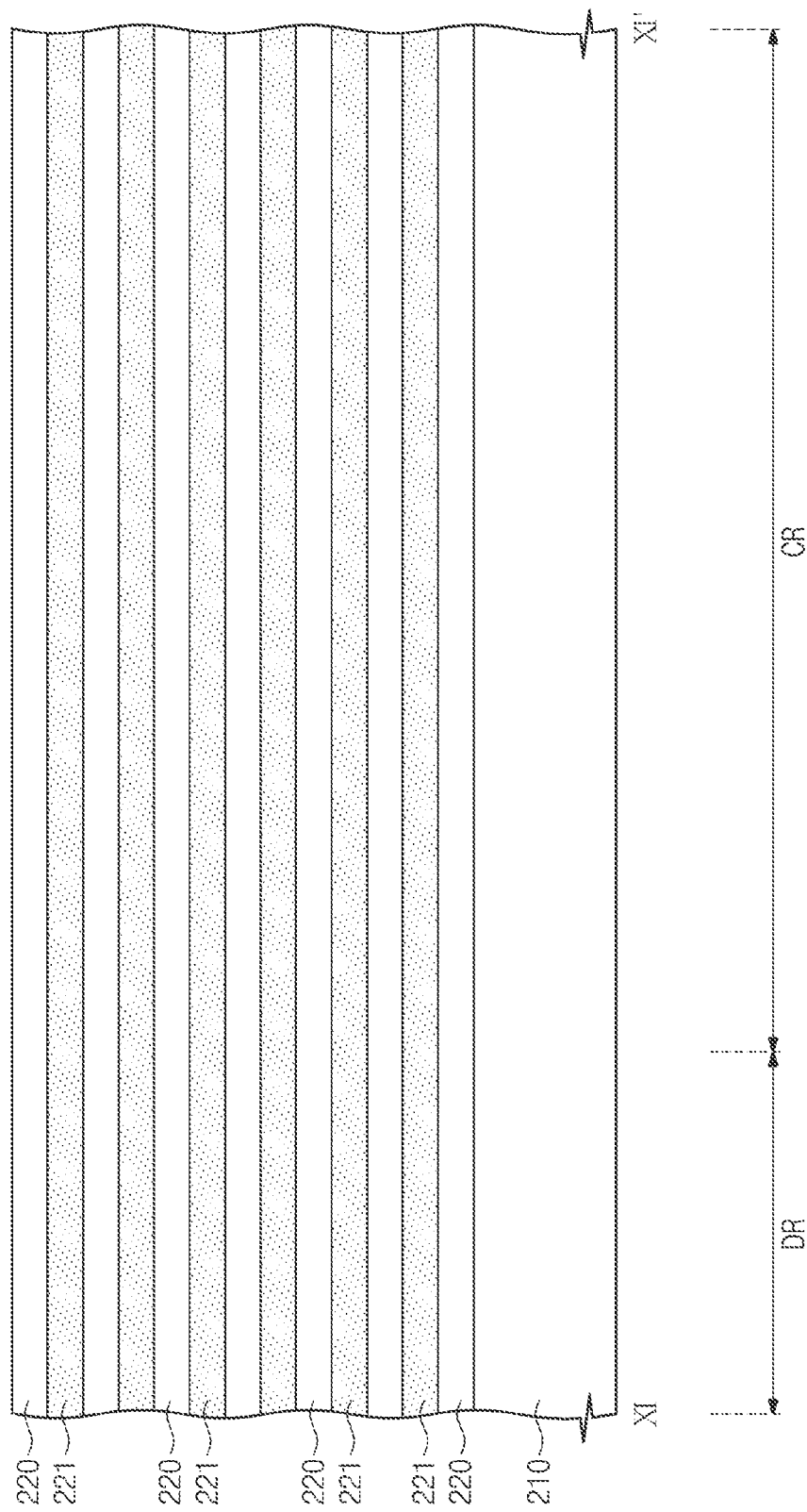

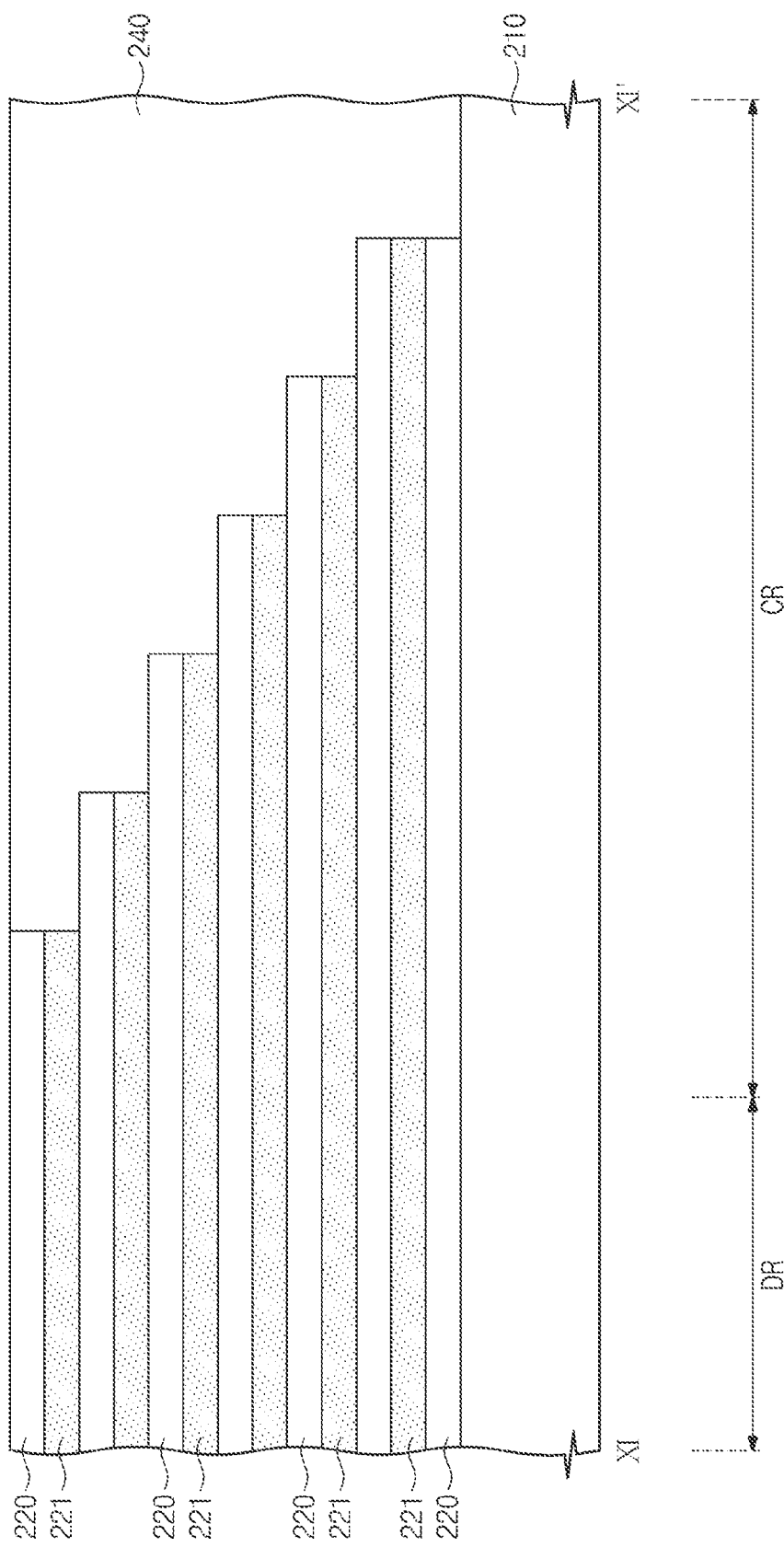

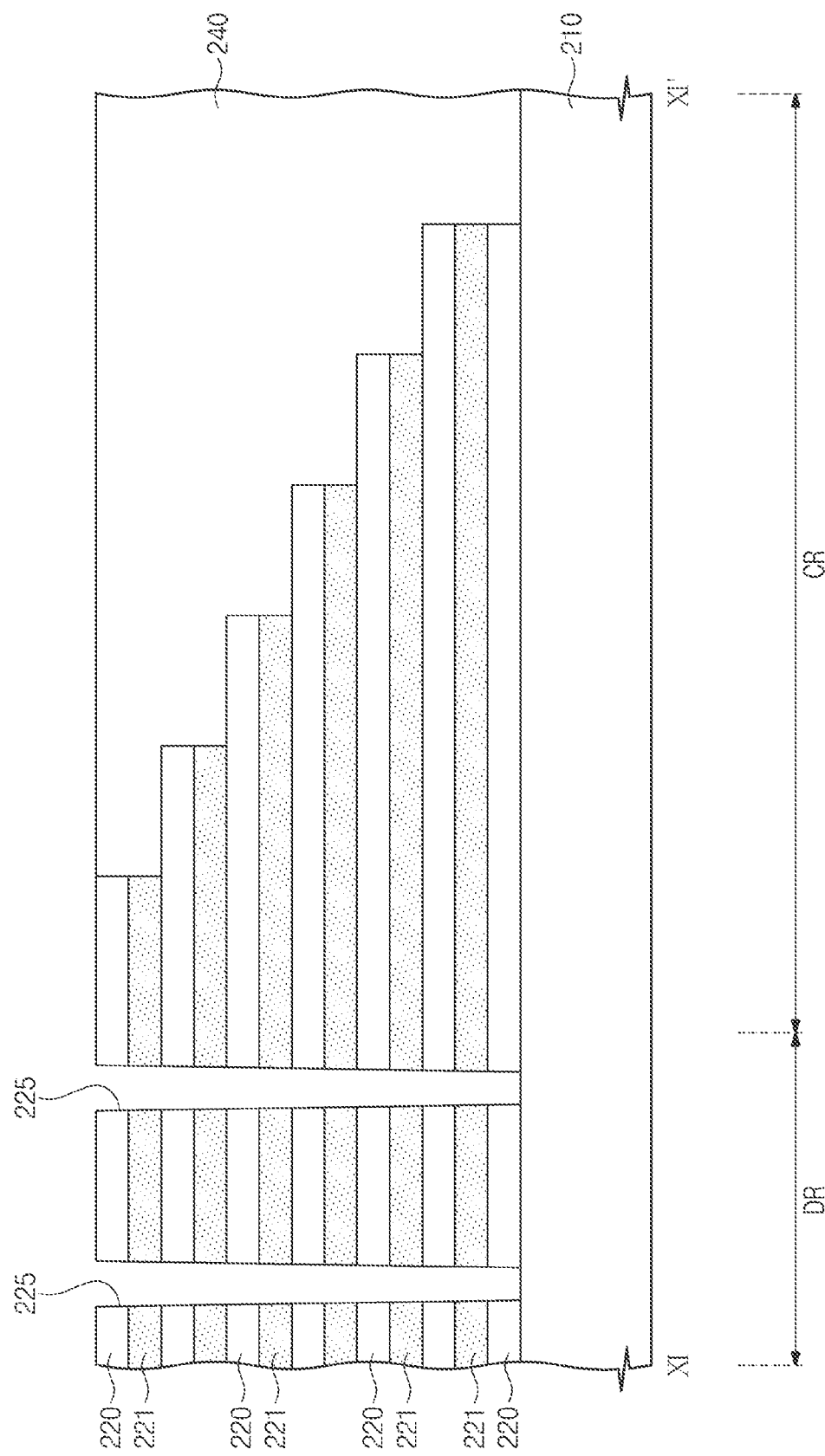

SEMICONDUCTOR DEVICE AND METHOD FOR MANUFACTURING THE SAME

CROSS-REFERENCE TO RELATED APPLICATION

This is a continuation of U.S. application Ser. No. 15/591,736, filed on May 10, 2017, which is a continuation of U.S. application Ser. No. 14/956,735, filed on Dec. 2, 2015, which claims priority under 35 U.S.C. § 119 to Korean Patent Application No. 10-2014-0177548, filed on Dec. 10, 2014, in the Korean Intellectual Property Office, the entire contents of which are hereby incorporated by reference in its entirety.

BACKGROUND

The present disclosure relates to a semiconductor device and a method for manufacturing the same. More particularly, the present disclosure relates to a semiconductor device including a contact plug and a method for manufacturing the same.

Volumes of electronic products have been reduced, but electronic products processing massive data have been demanded. Thus, integration density of semiconductor memory devices used in electronic products has increased. A non-volatile memory device having a vertical transistor structure instead of a conventional planar transistor structure has been developed to improve the integration density of the semiconductor memory device. In the non-volatile memory device having the vertical transistor structure, contact plugs may be formed simultaneously on a plurality of electrodes disposed at different levels from each other.

SUMMARY

Example embodiments of inventive concepts may provide a semiconductor device including a contact plug being in stable contact with a conductive pattern.

Example embodiments of inventive concepts may also provide a method for manufacturing a semiconductor device including a contact plug being in stable contact with a conductive pattern.

According to example embodiments, a semiconductor device may include: a substrate; a conductive pattern on the substrate; a filling insulation layer covering the conductive pattern; and a contact plug on the substrate. The contact plug includes a contact plate in the conductive pattern and electrically connected to the conductive pattern and a contact body contacting a top surface of the contact plate and penetrating the filling insulation layer. A width of the top surface of the contact plate may be greater than a width of a bottom surface of the contact body.

In example embodiments, the contact plate may have a circular plate structure.

In example embodiments, a material of the contact plate may be the same as a material of the contact body.

In example embodiments, the semiconductor device may further include: a barrier layer conformally covering a sidewall of the contact body and at least one of the top surface of the contact plate, a side surface of the contact plate, and a bottom surface of the contact plate.

In example embodiments, the contact plate may penetrate the conductive pattern.

According to example embodiments, a method for manufacturing a semiconductor device may include: forming a conductive pattern on a substrate; forming a filling insulation layer covering the conductive pattern; forming a contact hole in the filling insulation layer, the contact hole penetrating the filling insulation layer, the contact hole being adjacent to the conductive pattern; forming an opening in the conductive pattern by removing a portion of the conductive pattern adjacent to the contact hole, the opening being connected to the contact hole; and forming a contact plug filling the contact hole and the opening. A width of the opening may be greater than a width of the contact hole.

In example embodiments, the method may further include: forming a barrier layer conformally covering inner surfaces of the contact hole and the opening before the forming the contact plug.

In example embodiments, the opening may extend from a top surface to a bottom surface of the conductive pattern.

In example embodiments, the forming the contact hole may include exposing the conductive pattern through the contact hole.

In example embodiments, the forming the opening may include: performing a wet etching process to remove the portion of the conductive pattern.

In example embodiments, an etch rate of the conductive pattern may be higher than an etch rate of the filling insulation layer during the wet etching process.

In example embodiments, the forming the contact hole may include: performing a dry etching process to remove a portion of the filling insulation layer.

In example embodiments, the forming the contact hole may include: leaving a residue of the filling insulation layer on the conductive pattern under the contact hole. The forming the opening may include removing residue during the performing the wet etching process.

According to example embodiments, a semiconductor device may include: a first electrode on a substrate, the first electrode including a first extension portion and a first contact portion extending from the first extension portion; a second electrode on the first electrode and exposing the first contact portion, the second electrode including a second extension portion and a second contact portion extending from the second extension portion; a first insulating layer between the substrate and the first electrode; a second insulating layer between the first electrode and the second electrode; a filling insulation layer covering the first electrode and the second electrode; a first contact plug including a first contact plate and a first contact body, the first contact plate inserted in the first contact portion and electrically connected to the first electrode, and the first contact body being in contact with a top surface of the first contact plate and penetrating the filling insulation layer; and a second contact plug including a second contact plate and a second contact body, the second contact plate inserted in the second contact portion and electrically connected to the second electrode, and the second contact body being in contact with a top surface of the second contact plate and penetrating the filling insulation layer. A width of the top surface of the first contact plate may be greater than a width of a bottom surface of the first contact body, and a width of the top surface of the second contact plate may be greater than a width of a bottom surface of the second contact body.

In example embodiments, the first and second contact plates may have circular plate structures.

In example embodiments, the first contact plate may penetrate the first electrode, and the second contact plate may penetrate the second electrode.

In example embodiments, the semiconductor device may further include: a third electrode disposed between the first electrode and the second insulating layer to expose the first contact portion, the third electrode including a third extension portion and a third contact portion connected to the third extension portion, and the third contact portion exposed by the second electrode; a third insulating layer disposed between the third electrode and the first electrode; and a third contact plug including a third contact plate and a third contact body. The third contact plate may be inserted in the third contact portion and may be electrically connected to the third electrode. The third contact body may be in contact with a top surface of the third contact plate and may penetrate the filling insulation layer.

In example embodiments, the substrate may include a device region and a connection region. The first extension portion, the first contact portion, the second extension portion, and the second contact portion may be provided on the connection region. The first electrode may further include a first gate portion extending from the first extension portion onto the device region, and the second electrode may further include a second gate portion extending from the second extension portion onto the device region. The first insulating layer may extend into between the substrate and the first gate portion, and the second insulating layer may extend into between the first gate portion and the second gate portion. In this case, the semiconductor device may further include a vertical channel structure penetrating the first and second insulating layers and the first and second gate portions.

According to example embodiments, a method for manufacturing a semiconductor device may include: forming a first insulating layer, a first electrode, a second insulating layer, and a second electrode which are sequentially stacked on a substrate, the first electrode including a first extension portion and a first contact portion extending from the first extension portion, the second electrode exposing the first contact portion, and the second electrode including a second extension portion and a second contact portion extending from the second extension portion; forming a filling insulation layer covering the first electrode and the second electrode; forming a first contact hole and a second contact hole, the first contact hole penetrating the filling insulation layer so as to be adjacent to the first contact portion, and the second contact hole penetrating the filling insulation layer so as to be adjacent to the second contact portion; forming a first opening and a second opening by removing a portion of the first electrode adjacent to the first contact hole and a portion of the second electrode adjacent to the second contact hole, the first opening connected to the first contact hole, and the second opening connected to the second contact hole; and forming a first contact plug filling the first contact hole and the first opening and a second contact plug filling the second contact hole and the second opening. A width of the first opening may be greater than a width of the first contact hole, and a width of the second opening may be greater than a width of the second contact hole.

In example embodiments, forming the first and second openings may include: performing a wet etching process to remove the portion of the first electrode and the portion of the second electrode.

In example embodiments, the first and second contact holes may be formed using a dry etching process at the same time, and the first electrode may not be exposed by the dry etching process.

In example embodiments, forming the first contact hole may include leaving a residue on the first electrode under the first contact hole. The residue may be removed by the wet etching process.

In example embodiments, etch rates of the first and second electrodes may be higher than that of the filling insulation layer during the wet etching process.

In example embodiments, the substrate may include a device region and a connection region. The first extension portion, the first contact portion, the second extension portion, and the second contact portion may be formed on the connection region. The first electrode may further include a first gate portion extending from the first extension portion onto the device region, and the second electrode may further include a second gate portion extending from the second extension portion onto the device region. The first insulating layer may extend into between the substrate and the first gate portion, and the second insulating layer may extend into between the first gate portion and the second gate portion. In this case, the method may further include: forming a vertical channel structure penetrating the first and second insulating layers and the first and second gate portions before forming the first and second contact holes.

According to example embodiments, a method of manufacturing a semiconductor device includes forming an electrode on a substrate; forming an insulating layer on the electrode; forming a hole in the insulating layer over the electrode; forming a space in the electrode by removing a part of the electrode underneath the hole of the insulating layer, the space in the electrode being in fluid communication with the hole of the insulating layer, and a width of the space in the electrode being greater than a width of the hole in the insulating layer; and forming a contact plug filling the hole in the insulating layer and the space in the electrode.

In example embodiments, the forming the space in the electrode may include forming an opening that extends through an entire thickness of the electrode.

In example embodiments, the forming the space in the electrode may include performing a wet etching process to remove the part of the electrode.

In example embodiments, the method may further include forming a stack structure on the substrate before the forming the hole in the insulating layer over the electrode. The forming the stack structure may include forming a plurality of electrodes and insulating layers alternately stacked on top of each other in a vertical direction on the substrate. A lowermost one of the plurality of electrodes may be the electrode formed during the forming the electrode on the substrate. The forming the stack structure may include forming a stepwise structure in at least one end of the plurality of electrodes and insulating layers alternately stacked. The forming the hole in the insulating layer may include etching holes in the plurality of insulating layers toward the stepwise structure and leaving a residual portion of one of the plurality of insulating layers on the lowermost one of the plurality of electrodes. The forming the space in the electrode may include removing the residual portion.

In example embodiments, the method may further include forming vertical holes through a device region of the stack structure, forming vertical channel structures in the vertical holes, and connecting the vertical channel structures to bit lines.

According to example embodiments, a method of manufacturing a semiconductor device includes forming a stack structure on a substrate and forming a contact plug. The stack structure includes an insulating layer on an electrode. The electrode defines an opening having a first width at one end that extends at least partially through the electrode. The insulating layer defines a hole in fluid communication with the opening in the electrode. The hole has a second width that is less than the first width. The contact plug fills the opening in the electrode and the hole in the insulating layer.

In example embodiments, the forming the stack structure may include forming the opening in the electrode such that the opening extends through an entire thickness of the electrode.

In example embodiments, the forming the stack structure may include forming a partial opening in the insulating layer such that a residual portion of the insulating layer is exposed by the partial opening, and the forming the opening in the electrode may include removing the residual portion of the insulating layer before removing a part of the electrode.

In example embodiments, the forming stack structure may include using a dry etch process to form the partial opening in the insulating layer and using a wet etch process to form the opening in the electrode.

BRIEF DESCRIPTION OF THE DRAWINGS

The foregoing and other features of inventive concepts will be apparent from the more particular description of non-limiting embodiments of inventive concepts, as illustrated in the accompanying drawings in which like reference characters refer to like parts throughout the different views. The drawings are not necessarily to scale, emphasis instead being placed upon illustrating principles of inventive concepts. In the drawings:

FIGS. 2A to 6A and 3C are plan views illustrating a method for manufacturing a semiconductor device according to example embodiments of inventive concepts;

FIGS. 2B to 6B and 3D are cross-sectional views taken along lines II-II', III-III', IV-IV', V-V', and VI-VI' of FIGS. 2A to 6A and 3C, respectively, to illustrate a method for manufacturing a semiconductor device according to example embodiments of inventive concepts;

FIGS. 11A to 11L are cross-sectional views corresponding to the line XI-XI' of FIG. 10 to illustrate a method for manufacturing a semiconductor device according to example embodiments of inventive concepts;

DETAILED DESCRIPTION OF EXAMPLE EMBODIMENTS

Figure 1A:
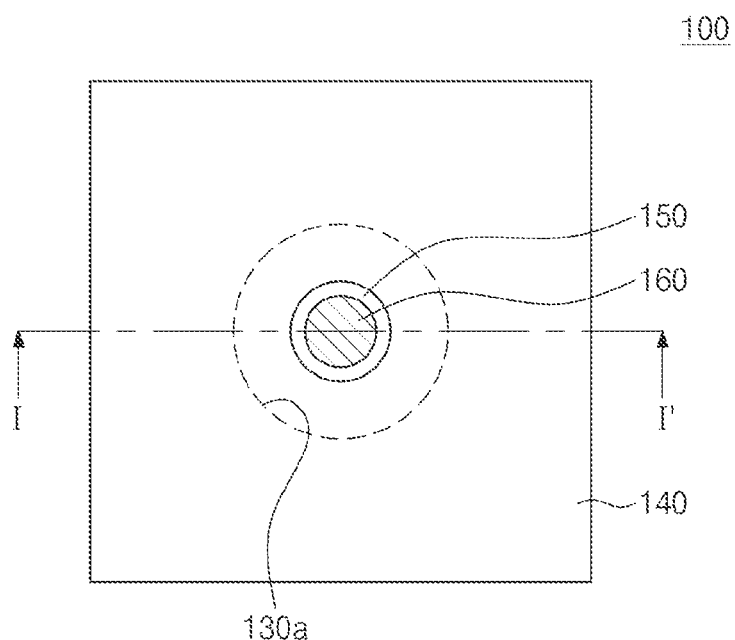
FIG. 1A is a plan view illustrating a semiconductor device according to example embodiments of inventive concepts.

Example embodiments of inventive concepts will now be described more fully hereinafter with reference to the accompanying drawings, in which some example embodiments of inventive concepts are shown. Example embodiments, may, however, be embodied in many different forms and should not be construed as being limited to the embodiments set forth herein; rather, these example embodiments are provided so that this disclosure will be thorough and complete, and will fully convey the scope of example embodiments of inventive concepts to those of ordinary skill in the art. In the drawings, the thicknesses of layers and regions are exaggerated for clarity. Like reference characters and/or numerals in the drawings denote like elements, and thus their description may be omitted.

The terminology used herein is for the purpose of describing particular embodiments only and is not intended to be limiting of example embodiments. As used herein, the singular terms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof. Expressions such as "at least one of," when preceding a list of elements, modify the entire list of elements and do not modify the individual elements of the list. As used herein, the term "and/or" includes any and all combinations of one or more of the associated listed items. It will be understood that when an element is referred to as being "connected" or "coupled" to another element, it may be directly connected or coupled to the other element or intervening elements may be present.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on").

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of example embodiments. It will be also understood that although the terms first, second, third etc. may be used herein to describe various elements, these elements should not be limited by these terms. These terms are only used to distinguish one element from another element. Thus, a first element, component, region, layer or section discussed below could be termed a second element, component, region, layer or section without departing from the teachings of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Figure 1B:
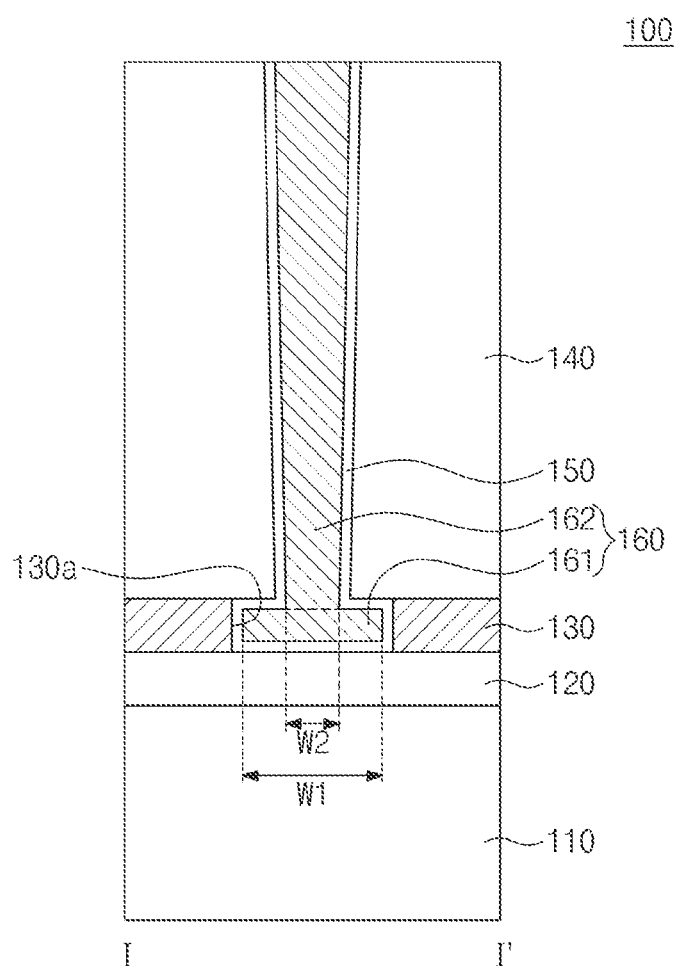
FIG. 1B is a cross-sectional view taken along a line I-I' of FIG. 1A to illustrate a semiconductor device according to example embodiments of inventive concepts.

FIG. 1A is a plan view illustrating a semiconductor device according to example embodiments of inventive concepts. FIG. 1B is a cross-sectional view taken along a line I-I' of FIG. 1A to illustrate a semiconductor device according to example embodiments of inventive concepts. Hereinafter, a semiconductor device according to example embodiments will be described with reference to FIGS. 1A and 1B.

Referring to FIGS. 1A and 1B, a semiconductor device 100 according to example embodiments of inventive concepts may include a substrate 110, a lower insulating layer 120, a conductive pattern 130, a filling insulation layer 140, a barrier layer 150, and a contact plug 160.

The substrate 110 may be a semiconductor substrate. For example, the semiconductor substrate may include at least one of a single-crystalline silicon layer, a silicon-on-insulator (SOI), a silicon layer formed on a silicon-germanium (SiGe) layer, a single-crystalline silicon layer formed on an insulating layer, or a poly-crystalline silicon layer formed on an insulating layer.

The lower insulating layer 120 may be disposed on the substrate 110. For example, the lower insulating layer 120 may include a silicon oxide layer, a silicon oxynitride layer, and/or a silicon nitride layer.

The conductive pattern 130 may be disposed on the lower insulating layer 120. The conductive pattern 130 may have an opening 130a that extends from a top surface to a bottom surface thereof. The opening 130a may have a circular shape when viewed from a plan view. The conductive pattern 130 may include at least one of poly-crystalline silicon doped with dopants, a metal (e.g., tungsten, copper, or aluminum), a conductive metal nitride (e.g., titanium nitride or tantalum nitride), a transition metal (e.g., titanium or tantalum), and/or a combination thereof.

The filling insulation layer 140 may cover the conductive pattern 130. However, the filling insulation layer 140 may not fill the opening 130a. The filling insulation layer 140 may include silicon oxide, silicon nitride, and/or silicon oxynitride.

The contact plug 160 may include a contact plate 161 and a contact body 162. The contact plate 161 may be inserted into the opening 130a of the conductive pattern 130 and may be electrically connected to the conductive pattern 130. The contact plate 161 may have a circular plate structure and may penetrate the conductive pattern 130 by filling the opening 130a. A bottom surface of the contact body 162 may be in contact with a top surface of the contact plate 161. A width W1 of the top surface of the contact plate 161 may be greater than a width W2 of the bottom surface of the contact body 162. In other words, an area of the top surface of the contact plate 161 may be greater than an area of the bottom surface of the contact body 162. The contact body 162 may vertically extend from the top surface of the contact plate 161 to penetrate the filling insulation layer 140. The contact plate 161 and the contact body 162 may include the same material. For example, the contact plate 161 and the contact body 162 may include at least one of a metal (e.g., tungsten, copper, or aluminum), a conductive metal nitride (e.g., titanium nitride or tantalum nitride), or a transition metal (e.g., titanium or tantalum).

The barrier layer 150 may conformally cover a surface of the contact plate 161 and a sidewall of the contact body 162. However, the barrier layer 150 may not cover a portion of the top surface of the contact plate 161 which is in contact with the contact body 162. Thus, the barrier layer 150 may be disposed between the contact plug 160 and the lower insulating layer 120, between the contact plug 160 and the conductive pattern 130 and between the contact plug 160 and the filling insulation layer 140. The contact plate 161 may be electrically connected to the conductive pattern 130 through the barrier layer 150 interposed therebetween. The barrier layer 150 may include a conductive metal nitride (e.g., titanium nitride or tantalum nitride).

According to example embodiments of inventive concepts, the contact plug 160 may be electrically connected to the conductive pattern 130 through the contact plate 161 inserted in the conductive pattern 130. Thus, a contact area between the conductive pattern 130 and the contact plug 160 may be increased to reduce a contact resistance between the conductive pattern 130 and the contact plug 160.

FIGS. 2A to 6A and 3C are plan views illustrating a method for manufacturing a semiconductor device according to example embodiments of inventive concepts. FIGS. 2B to 6B and 3D are cross-sectional views taken along lines II-II', III-III', IV-IV', V-V', and VI-VI' of FIGS. 2A to 6A and 3C, respectively, to illustrate a method for manufacturing a semiconductor device according to example embodiments of inventive concepts. Hereinafter, the method for manufacturing the semiconductor device according to example embodiments will be described with reference to FIGS. 2A to 6A, 3C, 2B to 6B, and 3D. The same elements as described with reference to FIGS. 1A and 1B will be indicated by the same reference numerals or the same reference designators. For the purpose of ease and convenience in explanation, the descriptions to the same elements as in FIGS. 1A and 1B will be omitted or mentioned briefly.

Figure 2A:
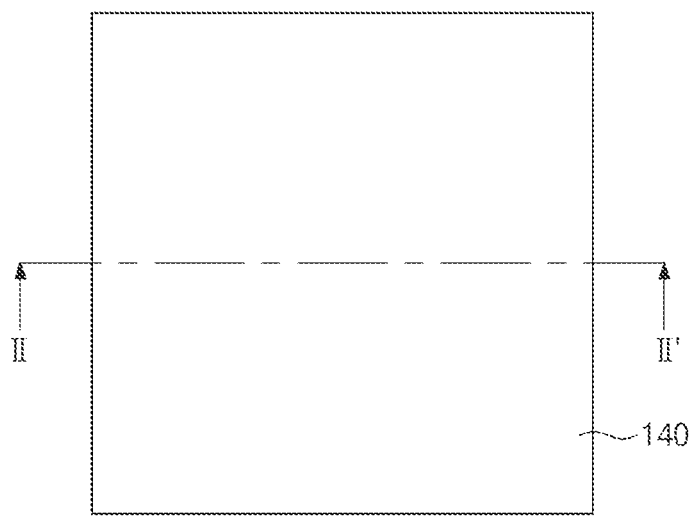
Figure 2B:
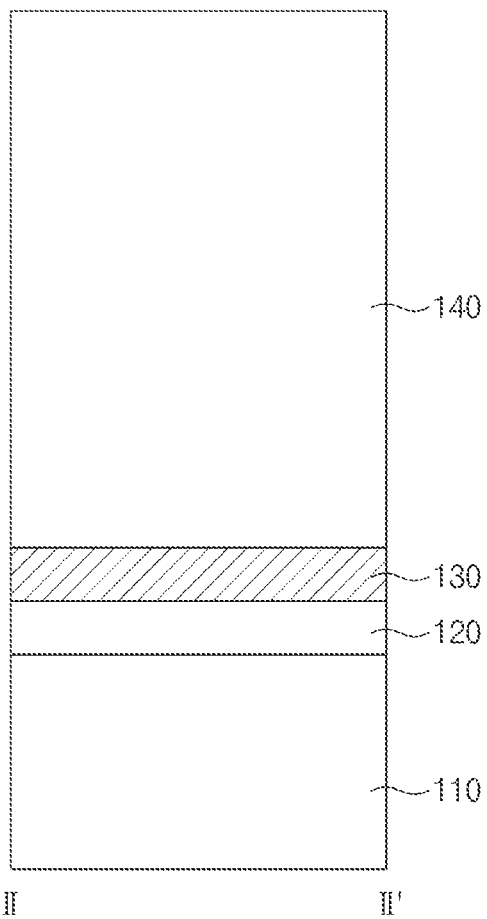

Referring to FIGS. 2A and 2B, a lower insulating layer 120, a conductive pattern 130, and a filling insulation layer 140 may be sequentially formed on a substrate 110.

The substrate 110 may be a semiconductor substrate. For example, the semiconductor substrate may include at least one of a single-crystalline silicon layer, a silicon-on-insulator (SOI), a silicon layer formed on a silicon-germanium (SiGe) layer, a single-crystalline silicon layer formed on an insulating layer, or a poly-crystalline silicon layer formed on an insulating layer.

The lower insulating layer 120 may be formed on the substrate 110. For example, the lower insulating layer 120 may include silicon oxide, silicon nitride, or silicon oxynitride. The lower insulating layer 120 may be formed by, for example, a thermal oxidation process or a chemical vapor deposition (CVD) method.

The conductive pattern 130 may be formed on the lower insulating layer 120. The conductive pattern 130 may be formed using, for example, a physical vapor deposition (PVD) method or a CVD method. The conductive pattern 130 may include at least one of poly-crystalline silicon doped with dopants, a metal (e.g., tungsten, copper, or aluminum), a conductive metal nitride (e.g., titanium nitride or tantalum nitride), or a transition metal (e.g., titanium or tantalum).

The filling insulation layer 140 may be formed on the conductive pattern 130. The conductive pattern 130 may be covered by the filling insulation layer 140. The filling insulation layer 140 may be formed by, for example, a CVD method. The filling insulation layer 140 may include silicon oxide, silicon nitride, or silicon oxynitride.

Referring to FIGS. 3A and 3B, or FIGS. 3C and 3D, a contact hole 140a may be formed in the filling insulation layer 140. The contact hole 140a may penetrate the filling insulation layer 140 so as to be adjacent to the conductive pattern 130. In example embodiments, a mask (not shown) which exposes a portion of the filling insulation layer 140 may be formed on the filling insulation layer 140, and the filling insulation layer 140 may be etched using the mask as an etch mask to form the contact hole 140a. At this time, the filling insulation layer 140 may be etched by a dry etching process, and an etch rate of the filling insulation layer 140 may be higher than that of the conductive pattern 130 during the dry etching process.

Figure 3A:
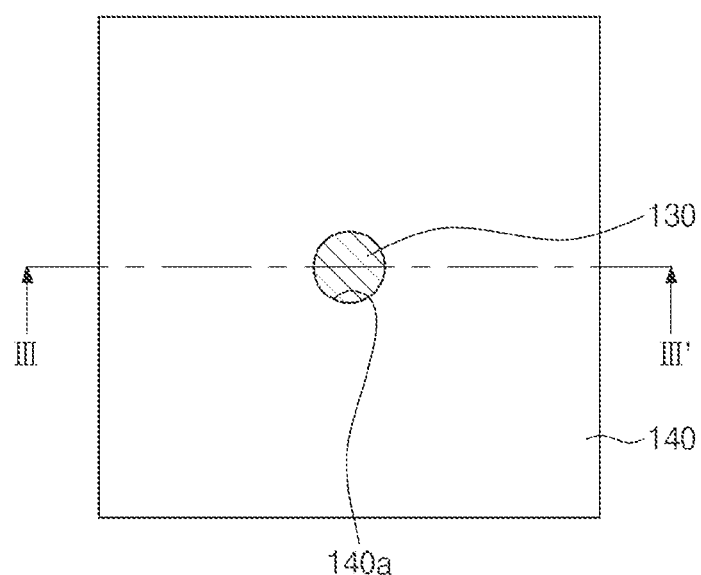
Figure 3B:
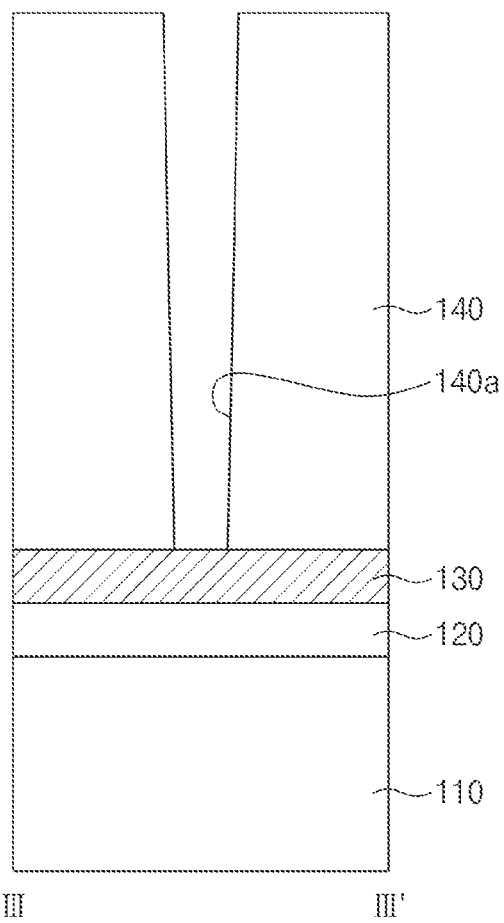
Figure 3C:
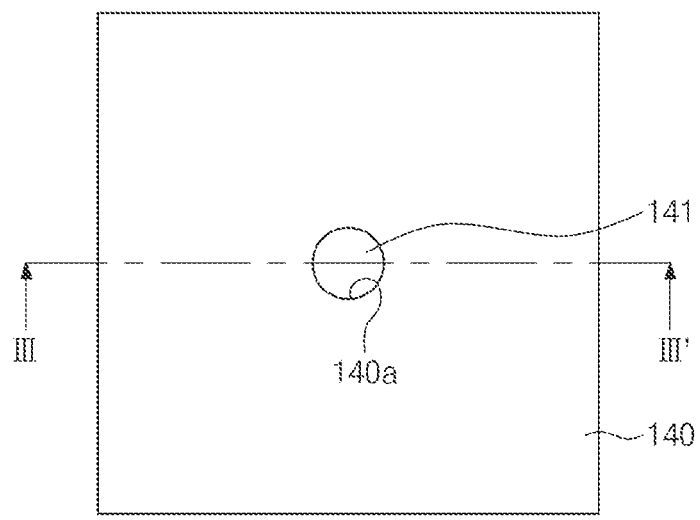
Figure 3D:
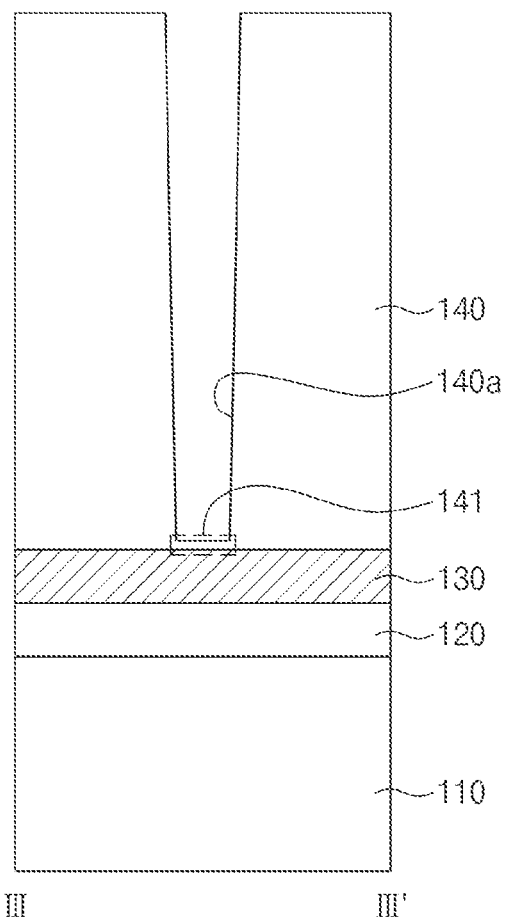

A depth of the contact hole 140a may be varied depending on a process time of the dry etching process and/or process uniformity. The depth of the contact hole 140a may be increased by a long process time and/or over-etching of the dry etching process. For example, as illustrated in FIGS. 3A and 3B, the conductive pattern 130 may be exposed by the contact hole 140a. In this case, the conductive pattern 130 exposed by the contact hole 140a may be partially etched. Alternatively, the depth of the contact hole 140a may be reduced by a short process time and/or un-etching of the dry etching process. For example, as illustrated in FIGS. 3C and 3D, the conductive pattern 130 may not be exposed by the contact hole 140a. In other words, a residue 141 of the filling insulation layer 140 may remain on the conductive pattern 130 under the contact hole 140a.

Figure 4A:
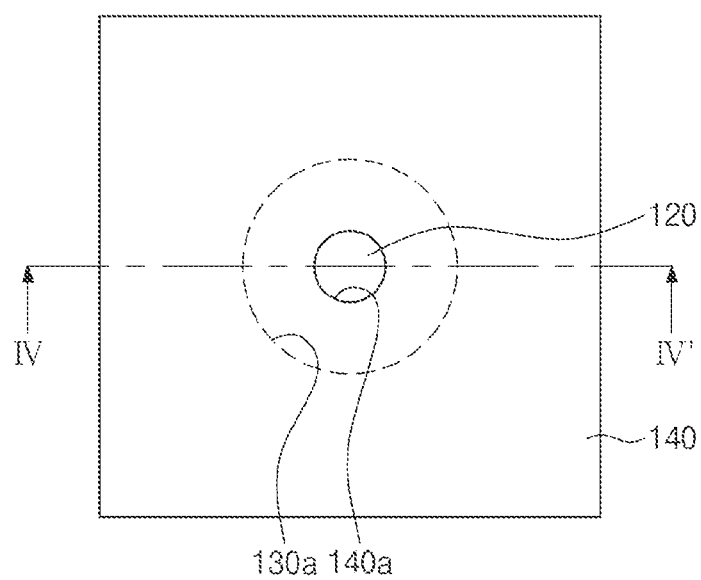
Figure 4B:
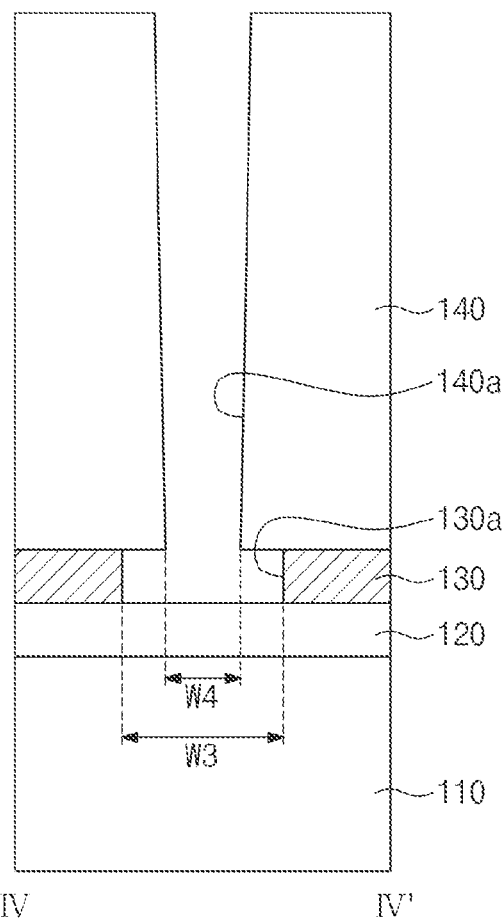

Referring to FIGS. 4A and 4B, a portion of the conductive pattern 130 which is adjacent to the contact hole 140a may be removed to form an opening 130a in the conductive pattern 130. The opening 130a may be formed by performing a wet etching process, and an etch rate of the conductive pattern 130 may be higher than those of the lower insulating layer 120 and the filling insulation layer 140 during the wet etching process. The filling insulation layer 140 may be slightly etched by the wet etching process. In other words, the filling insulation layer 140 of an inner sidewall of the contact hole 140a may be etched by the wet etching process, so a width of the contact hole 140a may be increased.

If a portion of the conductive pattern 130 is exposed by the contact hole 140a as illustrated in FIGS. 3A and 3B, the conductive pattern 130 may be etched from its exposed portion by the wet etching process. Thus, the opening 130a may extend from the top surface to the bottom surface of the conductive pattern 130, and a planar cross section of the opening 130a may have a circuit shape with the contact hole 140 as its center. The opening 130 may be connected to the contact hole 140a.

If the residue 141 of the filling insulation layer 140 is formed on the conductive pattern 130 under the contact hole 140a as illustrated in FIGS. 3C and 3D, the residue 141 of FIGS. 3C and 3D may be removed by the wet etching process. Since the residue 141 is removed, the contact hole 140a may extend to the top surface of the conductive pattern 130 and the conductive pattern 130 may be exposed through the contact hole 140a. Finally, the conductive pattern 130 may be etched from its exposed portion. As a result, the opening 130a may extend from the top surface to the bottom surface of the conductive pattern 130, and the planar cross section of the opening 130a may have the circuit shape with the contact hole 140a as its center. In addition, the opening 130 may be connected to the contact hole 140a.

A process time of the wet etching process may be controlled, so a size of the opening 130a may be adjusted. In other words, the etched amount of the conductive pattern 130 may be increased as the process time of the wet etching process is increased, so the size of the opening 130a may be increased. Thus, if the process time of the wet etching process is long enough, a width W3 of the opening 130a may be greater than a width W4 of the contact hole 140a (e.g., the width W4 of a bottom end of the contact hole 140a).

Figure 5A:
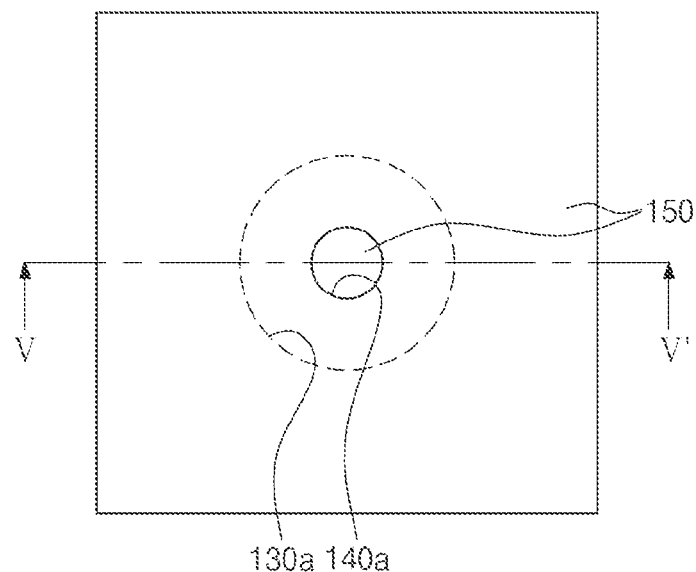
Figure 5B:
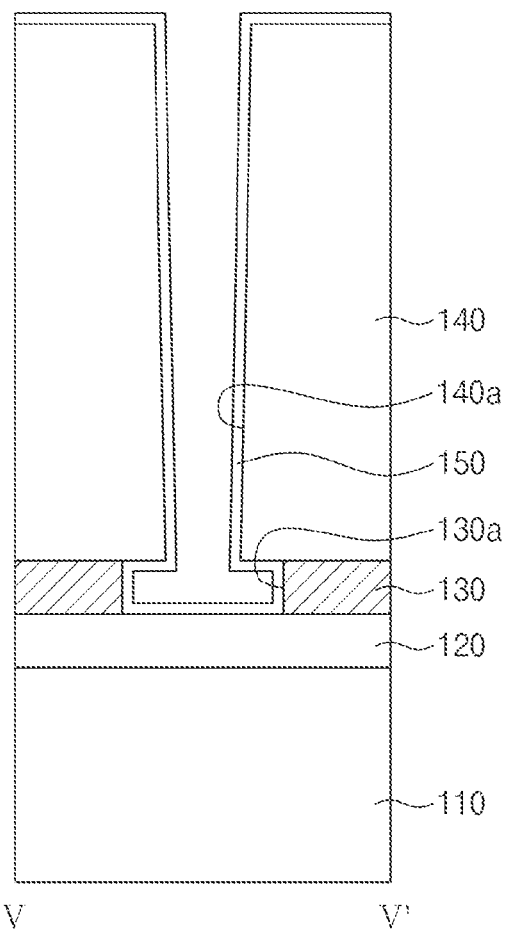

Referring to FIGS. 5A and 5B, a barrier layer 150 may be formed to conformally cover inner surfaces of the opening 130a and the contact hole 140a. The barrier layer 150 may be formed by, for example, a CVD method. The barrier layer 150 may include a conductive metal nitride (e.g., titanium nitride or tantalum nitride).

Figure 6A:
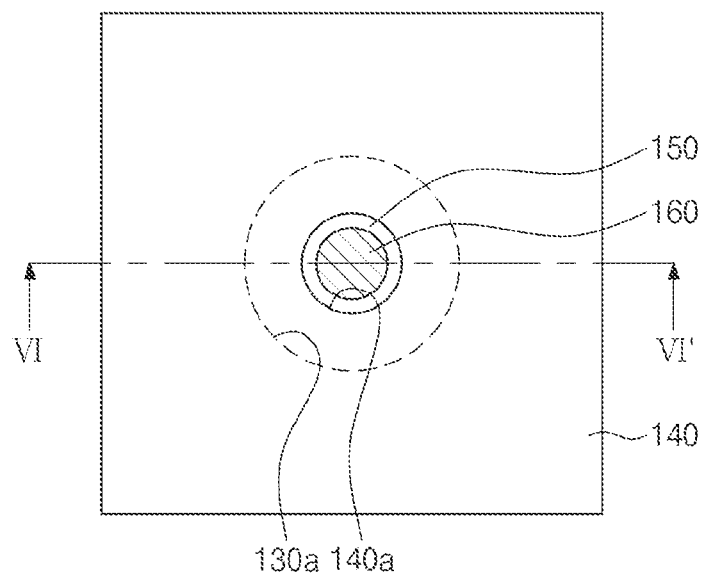
Figure 6B:
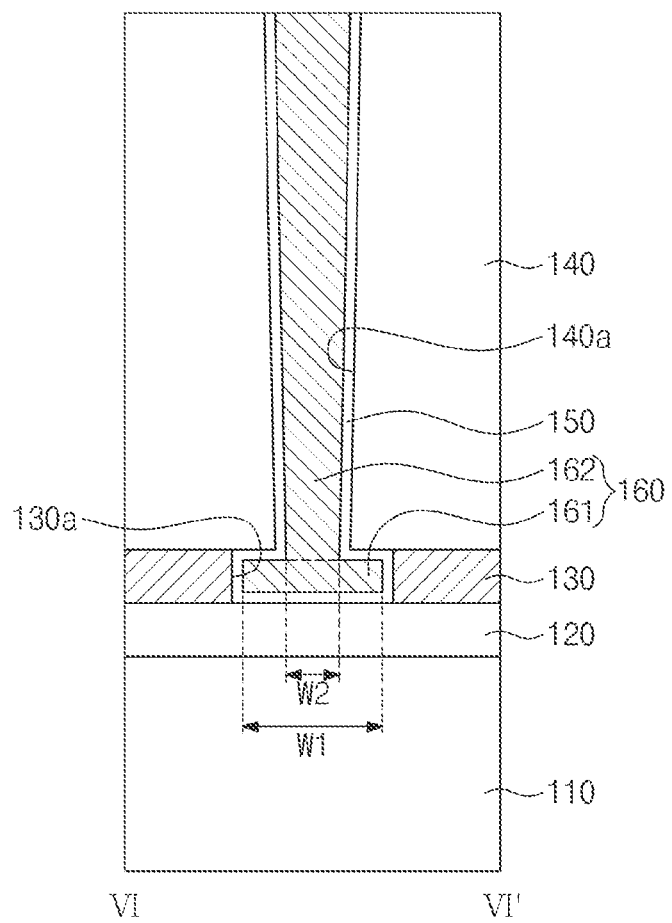

Referring to FIGS. 6A and 6B, a contact plug 160 may be formed to fill the opening 130a and the contact hole 140a. In example embodiments, a conductive layer may be formed to fill the opening 130a and the contact hole 140a, and the conductive layer and the barrier layer 150 may be planarized to form the contact plug 160. The conductive layer and the barrier layer 150 disposed on a top surface of the filling insulation layer 140 may be removed by the planarization process. The conductive layer may be formed by, for example, a CVD method. The contact plug 160 may include a contact plate 161 corresponding to a portion filling the opening 130a, and a contact body 162 corresponding to a portion filling the contact hole 140a. Since the opening 130a is connected to the contact hole 140a, a bottom surface of the contact body 162 may be in contact with a top surface of the contact plate 161. The contact plate 161 may be electrically connected to the conductive pattern 130 through the barrier layer 150. The contact plate 161 may have a circular plate structure by the shape of the opening 130a and may penetrate the conductive pattern 130. Since the width of the opening 130a is greater than the width of the contact hole 140a, a width W1 of the top surface of the contact plate 161 may be greater than a width W2 of the bottom surface of the contact body 162. The contact plate 161 and the contact body 162 may include the same material. For example, the contact plate 161 and the contact body 162 may include at least one of a metal (e.g., tungsten, copper, or aluminum), a conductive metal nitride (e.g., titanium nitride or tantalum nitride), or a transition metal (e.g., titanium or tantalum).

According to example embodiments of inventive concepts, even though the residue 141 of the filling insulation layer 140 remains on the conductive pattern 130 under the contact hole 140a by an insufficient depth of the contact hole (see 140a of FIGS. 3C and 3D), the residue 141 of FIGS. 3C and 3D may be removed by the wet etching process. Thus, the contact plug 160 may be in stable contact with the conductive pattern 130.

In addition, the contact plug 160 may be electrically connected to the conductive pattern 130 through the contact plate 161 inserted in the conductive pattern 130, so the contact area between the conductive pattern 130 and the contact plug 160 may be increased to reduce the contact resistance between the conductive pattern 130 and the contact plug 160.

Figure 7:
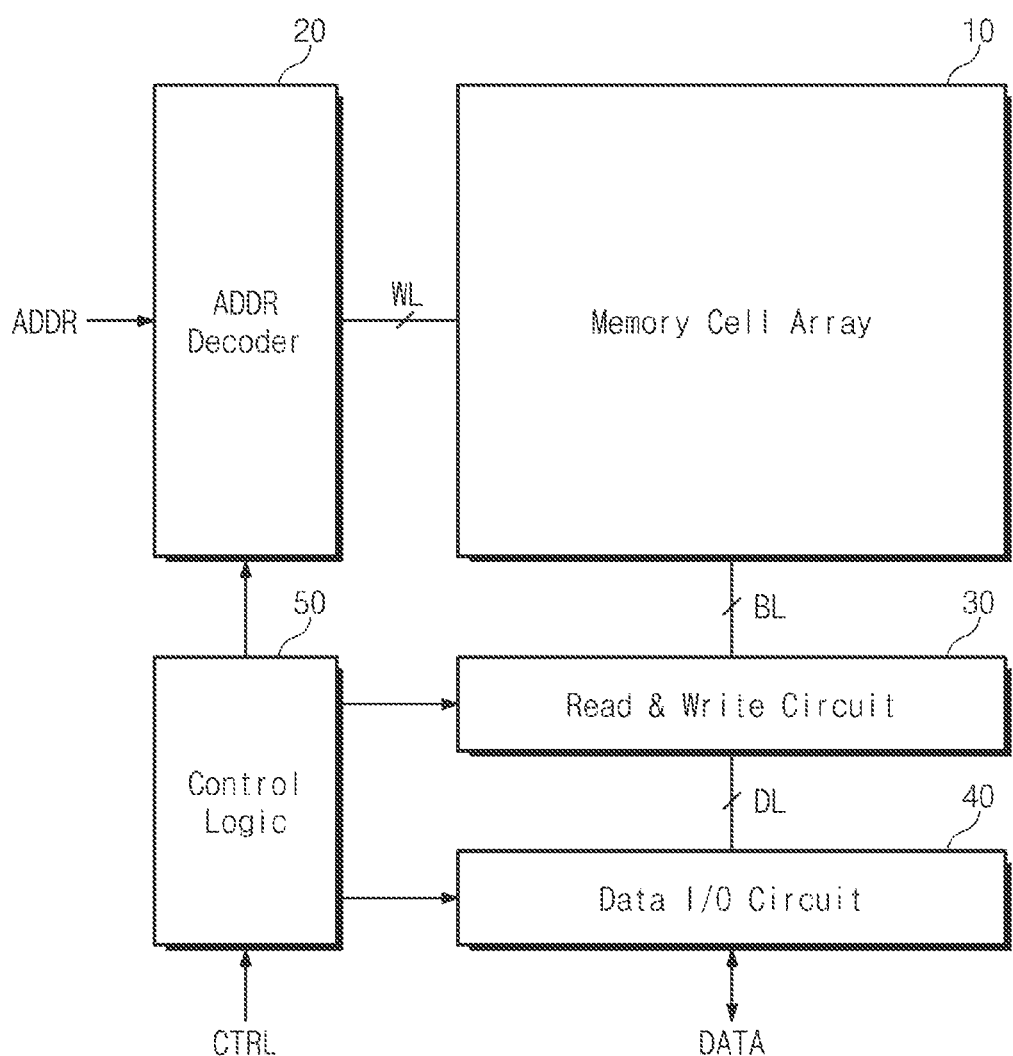
FIG. 7 is a schematic block diagram illustrating a semiconductor device according to example embodiments of inventive concepts.

FIG. 7 is a schematic block diagram illustrating a semiconductor device according to example embodiments of inventive concepts. Referring to FIG. 7, a semiconductor device according to example embodiments may include a memory cell array 10, an address decoder 20, a read/write circuit 30, a data input/output (I/O) circuit 40, and a control logic circuit 50.

In example embodiments, memory cell array 10 may be a three-dimensional (3D) memory array. The 3D memory array may include vertical NAND strings that are vertically oriented such that at least one memory cell is located over another memory cell. The at least one memory cell may comprise a charge trap layer. Each vertical NAND string may further include at least one select transistor located over memory cells. The at least one select transistor may have the same structure with the memory cells and may be formed monolithically together with the memory cells.

The following patent documents, which are hereby incorporated by reference in their entirety, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

The memory cell array 10 may be connected to the address decoder 20 through a plurality of word lines WL and may be connected to the read/write circuit 30 through bit lines BL. The memory cell array 10 includes a plurality of memory cells. For example, the memory cell array 10 may be configured to store one or more bits in one memory cell.

The address decoder 20 may be connected to the memory cell array 10 through the word lines WL. The address decoder 20 may be configured to operate in response to a control signal of the control logic circuit 50. The address decoder 20 may receive address signals ADDR from an external system. The address decoder 20 may decode a row address signal of the received address signals ADDR to select a corresponding one of the plurality of word lines WL. In addition, the address decoder 20 may decode a column address signal of the received address signals ADDR and may transmit the decoded column address signal to the read/write circuit 30. For example, the address decoder 20 may include known components such as a row decoder, a column decoder, and an address buffer.

The read/write circuit 30 may be connected to the memory cell array 10 through the bit lines BL and may be connected to the data I/O circuit 40 through data lines DL. The read/write circuit 30 may operate in response to a control signal of the control logic circuit 50. The read/write circuit 30 may be configured to receive the decoded column address signal from the address decoder 20. The read/write circuit 30 may select one of the bit lines BL by means of the decoded column address signal. For example, the read/write circuit 30 may receive data from the data I/O circuit 40 and may write the received data in the memory cell array 10. In addition, the read/write circuit 30 may read data from the memory cell array 10 and may transmit the read data to the data I/O circuit 40. The read/write circuit 30 may read data from a first storage region of the memory cell array 10 and may write the read data in a second storage region of the memory cell array 10. For example, the read/write circuit 30 may be configured to perform a copy-back operation.

The read/write circuit 30 may include components including a page buffer (or a page register) and a column selection circuit. In example embodiments, the read/write circuit 30 may include components including a sense amplifier, a write driver, and a column selection circuit.

The data I/O circuit 40 may be connected to the read/write circuit 30 through the data lines DL. The data I/O circuit 40 may operate in response to a control signal of the control logic circuit 50. The data I/O circuit 40 may be configured to exchange data DATA with an external system. The data I/O circuit 40 may transmit the data DATA inputted from the external system to the read/write circuit 30 through the data lines DL. In addition, the data I/O circuit 40 may output the data DATA transmitted from the read/write circuit 30 through the data lines DL to the external system. For example, the data I/O circuit 40 may include a component such as a data buffer.

The control logic circuit 50 may be connected to the address decoder 20, the read/write circuit 30, and the data I/O circuit 40. The control logic circuit 50 may be configured to control operations of the semiconductor device. The control logic circuit 50 may operate in response to a control signal CTRL transmitted from the external system.

Figure 8:
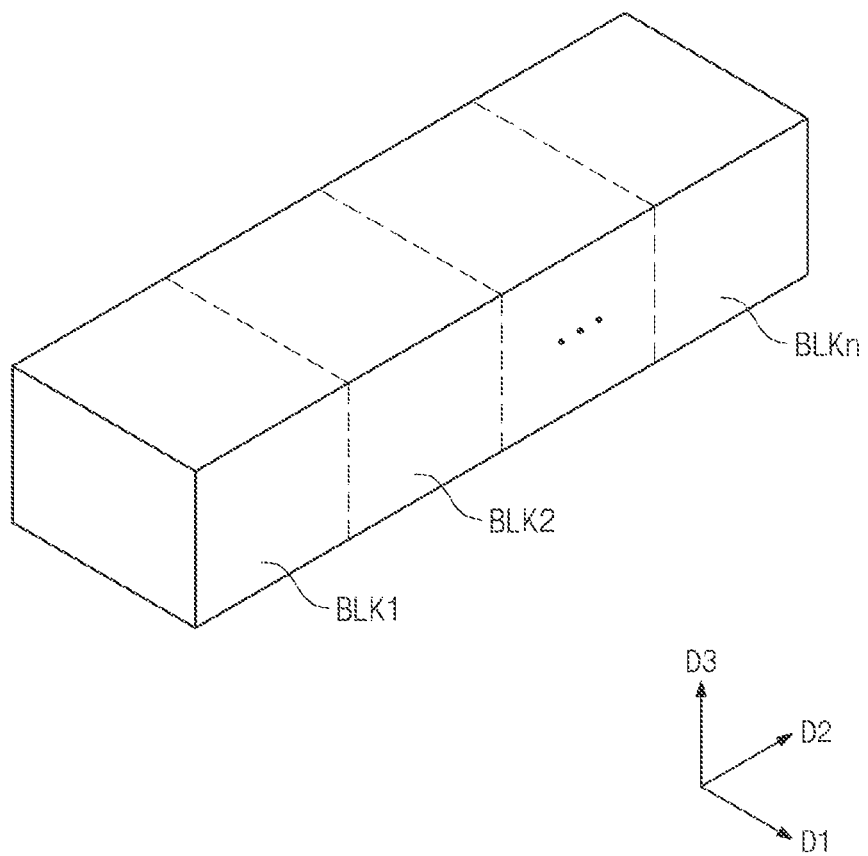
FIG. 8 is a perspective view illustrating an example of a memory cell array of FIG. 7.

FIG. 8 is a perspective view illustrating an example of a memory cell array of FIG. 7. Referring to FIG. 8, the memory cell array 10 may include a plurality of memory blocks BLK1 to BLKn. Each of the memory blocks BLK1 to BLKn may have a three-dimensional (3D) structure (or a vertical structure). For example, each of the memory blocks BLK1 to BLKn may include structures extending in first, second, and third directions D1, D2, and D3 intersecting each other. For example, each of the memory blocks BLK1 to BLKn may include a plurality of cell strings extending in the third direction D3.

Figure 9:
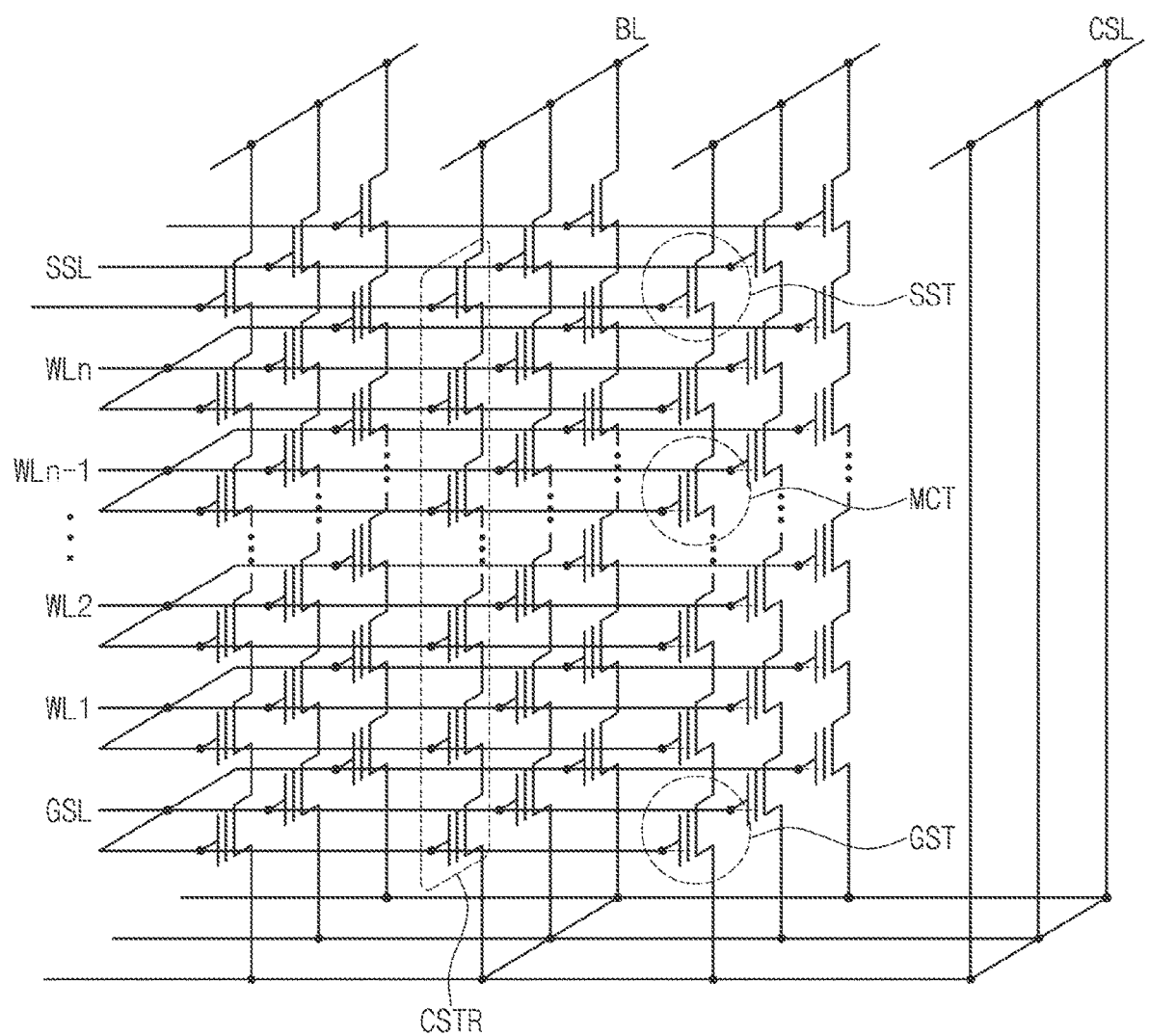
FIG. 9 is a schematic circuit diagram illustrating a cell array of a memory block of FIG. 8 according to example embodiments of inventive concepts.

FIG. 9 is a schematic circuit diagram illustrating a cell array of a memory block of FIG. 8 according to example embodiments of inventive concepts. Referring to FIG. 9, a semiconductor device according to example embodiments may include a common source line CSL, bit lines BL, and a plurality of cell strings CSTR disposed between the common source line CSL and the bit lines BL. A plurality of the cell strings CSTR may be connected in parallel to each of the bit lines BL.

Each of the cell strings CSTR may include a ground selection transistor GST connected to the common source line CSL, a string selection transistor SST connected to each of the bit lines BL, and a plurality of memory cell transistors MCT connected between the selection transistors GST and SST. The ground selection transistor GST, the memory cell transistors MCT, and the string selection transistor SST may be connected in series in the order named. A ground selection line GSL, a plurality of word lines WL1 to WLn and a string selection line SSL may correspond to gate electrodes of the ground selection transistor GST, the memory cell transistors MCT and the string selection transistor SST, respectively.

Figure 10:
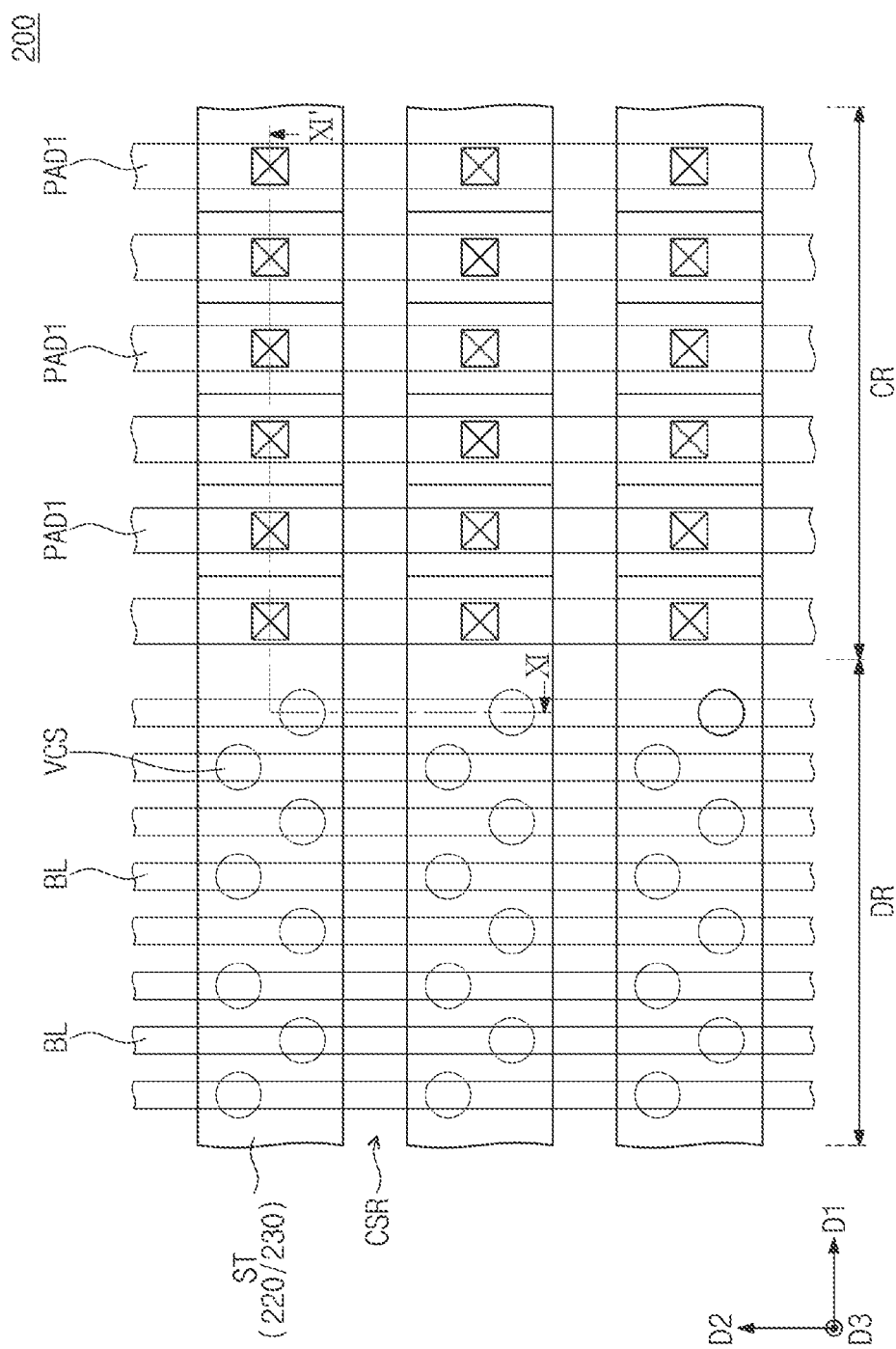
FIG. 10 is a plan view illustrating a semiconductor device according to example embodiments of inventive concepts.

FIG. 10 is a plan view illustrating a semiconductor device according to example embodiments of inventive concepts. FIG. 11M is a cross-sectional view taken along a line XI-XI' of FIG. 10. Hereinafter, a semiconductor device according to example embodiments of inventive concepts will be described with reference to FIGS. 10 and 11M.

Referring to FIGS. 10 and 11M, a semiconductor device 200 according to example embodiments may include a substrate 210, stack structures ST, a filling insulation layer 240, barrier layers 250, contact plugs 260, and vertical channel structures VCS.

The substrate 210 may include a device region DR and a connection region CR. The substrate 210 may be a semiconductor substrate having a first conductivity type (e.g., a P-type). The semiconductor substrate may include at least one of a single-crystalline silicon layer, a silicon-on-insulator (SOI), a silicon layer formed on a silicon-germanium (SiGe) layer, a single-crystalline silicon layer formed on an insulating layer, or a poly-crystalline silicon layer formed on an insulating layer.

Each of the stack structures ST may include a plurality of insulating layers 220 and a plurality of electrodes 230 which are alternately stacked on the substrate 210. The stack structures ST may extend in a first direction D1. Each of the electrodes 230 may include a gate portion GP, a contact portion CP, and an extension portion EP connected between the gate portion GP and the contact portion CP. The gate portion GP may be provided on the device region DR. The extension portion EP and the contact portion CP may be provided on the connection region CR. The electrodes 230 of each of the stack structures ST may have a stepwise structure on the connection region CR. In other words, lengths of the electrodes 230 in the first direction D1 may be sequentially reduced as a distance from the substrate 210 increases. In other words, lengths of the extension portions EP of the electrodes 230 may be sequentially reduced as a distance from the substrate 210 increases. Thus, the contact portion CP of the stacked electrodes 230 may be exposed. The contact portion CP of each of the electrodes 230 may have an opening 230a extending from a top surface to a bottom surface of each of the electrodes 230. A planar cross section of the opening 230a may have a circular shape (see FIGS. 1A and 1B). The electrodes 230 may include at least one of poly-crystalline silicon doped with dopants, a metal (e.g., tungsten, copper, or aluminum), a conductive metal nitride (e.g., titanium nitride or tantalum nitride), or a transition metal (e.g., titanium or tantalum). Each of the insulating layers 220 may include silicon oxide, silicon nitride, or silicon oxynitride.

The filling insulation layer 240 may cover end portions of the electrodes 230. However, the filling insulation layer 240 may not fill the openings 230a. The filling insulation layer 240 may include silicon oxide, silicon nitride, or silicon oxynitride.

Each of the contact plugs 260 may include a contact plate 261 and a contact body 262. The contact plate 261 may be inserted into the opening 230a of each of the electrodes 230 so as to be electrically connected to each of the electrodes 230. The contact plate 261 may have a circular plate structure and may penetrate a corresponding electrode 230 through the opening 230a. A bottom surface of the contact body 262 may be in contact with a top surface of the contact plate 261. A width W1 of the top surface of the contact plate 261 may be greater than a width W2 of the bottom surface of the contact body 262. In other words, an area of the top surface of the contact plate 261 may be greater than an area of the bottom surface of the contact body 262. In addition, a width W1a of the contact plate 261 corresponding to the uppermost electrode 230 may be greater than a width W1b of the contact plate 261 corresponding to the lowermost electrode 230. The contact body 262 may vertically extend from the top surface of the contact plate 261 to penetrate the filling insulation layer 240. The contact plate 261 and the contact body 262 may include the same material. For example, the contact plate 261 and the contact body 262 may include at least one of a metal (e.g., tungsten, copper, or aluminum), a conductive metal nitride (e.g., titanium nitride or tantalum nitride), or a transition metal (e.g., titanium or tantalum). First pads PAD1 may be provided on the filling insulation layer 240 so as to be connected to the contact plugs 260, respectively.

Each of the barrier layers 250 may conformally cover a surface of the contact plug 261 and a sidewall of the contact body 262 of each of the contact plugs 260. However, the barrier layer 250 may not cover a portion of the top surface of the contact plate 261 which is in contact with the contact body 262. In addition, the barrier layer 250 may not cover a top surface of the contact body 262. Thus, the barrier layer 250 may be disposed between the contact plug 260 and the insulating layers 220, between the contact plug 260 and the electrodes 230, and between the contact plug 260 and the filling insulation layer 240. The contact plate 261 may be electrically connected to the electrode 230 corresponding thereto through the barrier layer 250 interposed therebetween. The barrier layers 250 may include a conductive metal nitride (e.g., titanium nitride or tantalum nitride).

The vertical channel structures VCS may penetrate the stack structures ST on the device region DR. In other words, the vertical channel structures VCS may penetrate the insulating layers 220 and the gate portions GP of the electrodes 230. In example embodiments, the vertical channel structures VCS may be connected to the substrate 210. The vertical channel structures VCS penetrating each of the stack structures ST may be arranged in a zigzag form in the first direction D1 when viewed from a plan view. Alternatively, the vertical channel structures VCS penetrating each of the stack structures ST may be arranged in a line along the first direction D1 when viewed from a plan view. Each of the vertical channel structures VCS may include an active pillar AP and a data storage layer DS disposed on a sidewall of the active pillar AP.

In example embodiments, common source regions CSR may be formed in the substrate 210 between the stack structures ST. The common source regions CSR may extend in parallel along the first direction D1. The stack structures ST and the common source regions CSR may be alternately and repeatedly arranged in a second direction D2 intersecting the first direction D1 when viewed from a plan view. The common source regions CSR may be formed by providing dopants of a second conductivity type (e.g., a N-type) into the substrate 210. In other words, the common source regions CSR may have the conductivity type opposite to that of the substrate 210.

In example embodiments, a common source structure CSS may be disposed between the stack structures ST adjacent to each other. The common source structure CSS may include a sidewall insulating spacer SP covering sidewalls of the stack structures ST and a common source plug CSPLG penetrating the sidewall insulating spacer SP so as to be connected to the common source region CSR. The sidewall insulating spacer SP may include at least one of silicon oxide, silicon nitride, silicon oxynitride, or a low-k dielectric material having a low dielectric constant. The common source plug CSPLG may include at least one of a metal (e.g., tungsten, copper, or aluminum), a conductive metal nitride (e.g., titanium nitride or tantalum nitride), or a transition metal (e.g., titanium or tantalum). A common source line CSL may be provided on the common source structure CSS so as to be connected to the common source plug CSPLG.

A first capping insulating layer 270 may cover the stack structures ST and the filling insulation layer 240. The first capping insulating layer 270 may also cover the first pads PAD1 and the common source line CSL. The first capping insulating layer 270 may include a silicon oxide layer and/or a silicon nitride layer.

A second capping insulating layer 280 may be provided on the first capping insulating layer 270. The second capping insulating layer 280 may include a silicon oxide layer and/or a silicon nitride layer. Bit lines BL may be provided on the second capping insulating layer 280 to intersect the stack structures ST. The bit lines BL may extend in the second direction D2. The bit lines BL may be electrically connected to the vertical channel structures VCS through second pads PAD2 and bit line plugs BPLG. The second pads PAD2 may penetrate the first capping insulating layer 270, and the bit line plugs BPLG may penetrate the second capping insulating layer 280.

FIGS. 11A to 11L are cross-sectional views corresponding to the line XI-XI' of FIG. 10 to illustrate a method for manufacturing a semiconductor device according to example embodiments of inventive concepts. A method for manufacturing a semiconductor device according to example embodiments will be described with reference to FIGS. 11A to 11L. Hereinafter, the same elements as described with reference to FIGS. 10 and 11M will be indicated by the same reference numerals or the same reference designators, and the descriptions to the same elements will be omitted or mentioned briefly for the purpose of ease and convenience in explanation.

Referring to FIGS. 10 and 11A, insulating layers 220 and sacrificial layers 221 may be alternately stacked on a substrate 210. The substrate 210 may include a device region DR and a connection region CR. The substrate 210 may be a semiconductor substrate having a first conductivity type (e.g., a P-type). The semiconductor substrate may include at least one of a single-crystalline silicon layer, a silicon-on-insulator (SOI), a silicon layer formed on a silicon-germanium (SiGe) layer, a single-crystalline silicon layer formed on an insulating layer, or a poly-crystalline silicon layer formed on an insulating layer. The sacrificial layers 221 may include a material having a wet etch selectivity with respect to the insulating layers 220. For example, each of the sacrificial layers 221 may include a silicon nitride layer, a silicon oxynitride layer, a poly-crystalline silicon layer, or a poly-crystalline silicon-germanium layer. The sacrificial layers 221 and the insulating layers 220 may be formed by, for example, a CVD method.

Referring to FIGS. 10 and 11B, the insulating layers 220 and the sacrificial layers 221 on the connection region CR may be patterned to form a stepwise structure. In other words, lengths of the sacrificial layers 221 in a first direction D1 may be sequentially reduced as a distance from the substrate 210 increases. Next, a filling insulation layer 240 may be formed to cover end portions of the insulating layers 220 and sacrificial layers 221 on the connection region CR. The filling insulation layer 240 may include a material having a wet etch selectivity with respect to the sacrificial layers 221. For example, the filling insulation layer 240 may include the same material as the insulating layers 220.

Referring to FIGS. 10 and 11C, vertical holes 225 may be formed to penetrate the insulating layers 220 and the sacrificial layers 221 on the device region DR. The vertical holes 225 may expose the substrate 210. The process of forming the vertical holes 225 may include an anisotropic etching process.

Figure 11D:
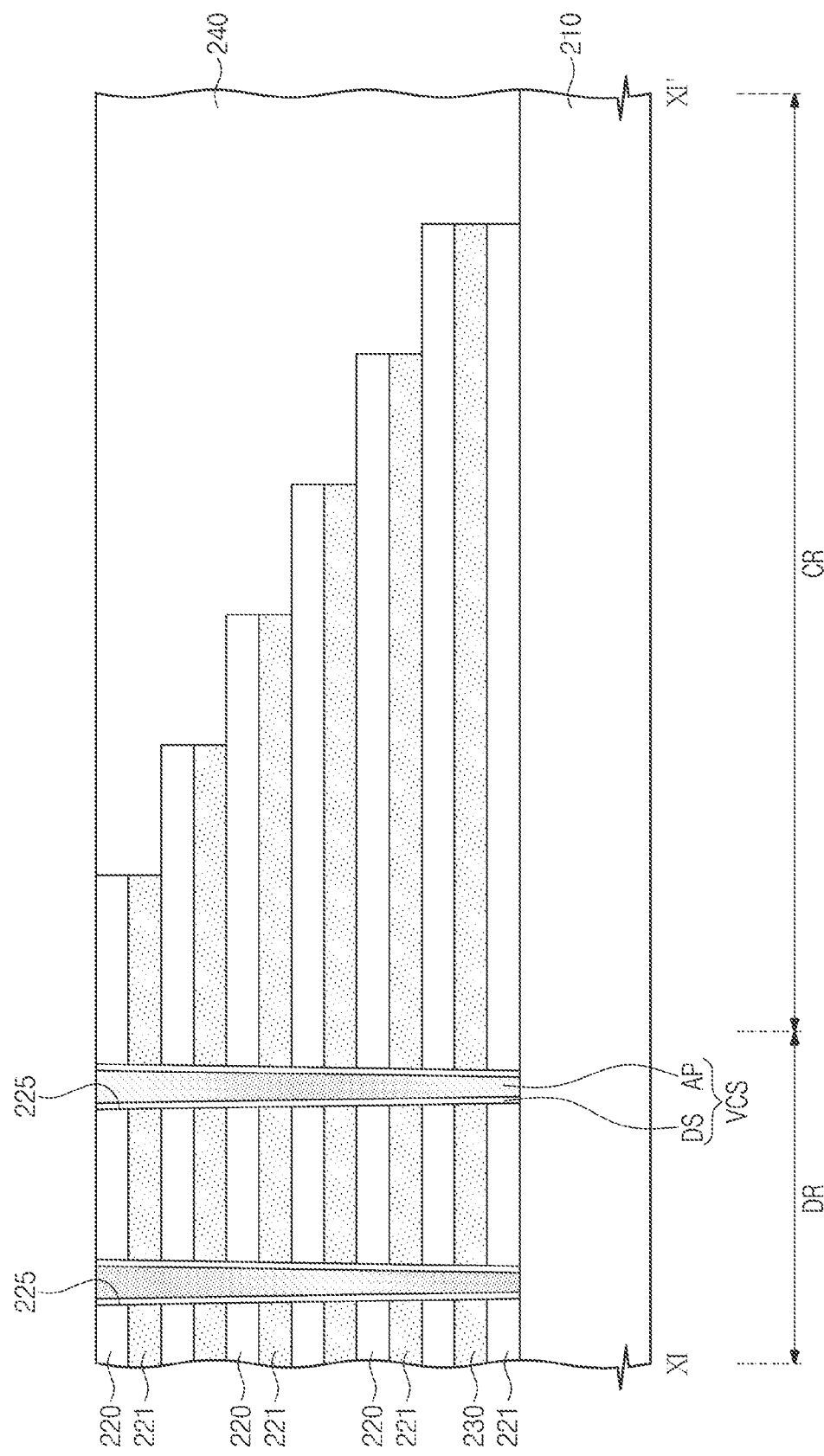

Referring to FIGS. 10 and 11D, vertical channel structures VCS may be formed to fill the vertical holes 225, respectively. Each of the vertical channel structures VCS may include an active pillar AP and a data storage layer DS disposed on a sidewall of the active pillar AP. The data storage layer DS may be formed on an inner sidewall of each of the vertical holes 225 by, for example, an atomic layer deposition (ALD) method. The active pillar AP may be formed in each of the vertical holes 225, and the data storage layer DS may be formed between the active pillar AP and the inner sidewall of the vertical hole 225. The active pillar AP may be formed using, for example, a CVD method or an ALD method.

Figure 11E:
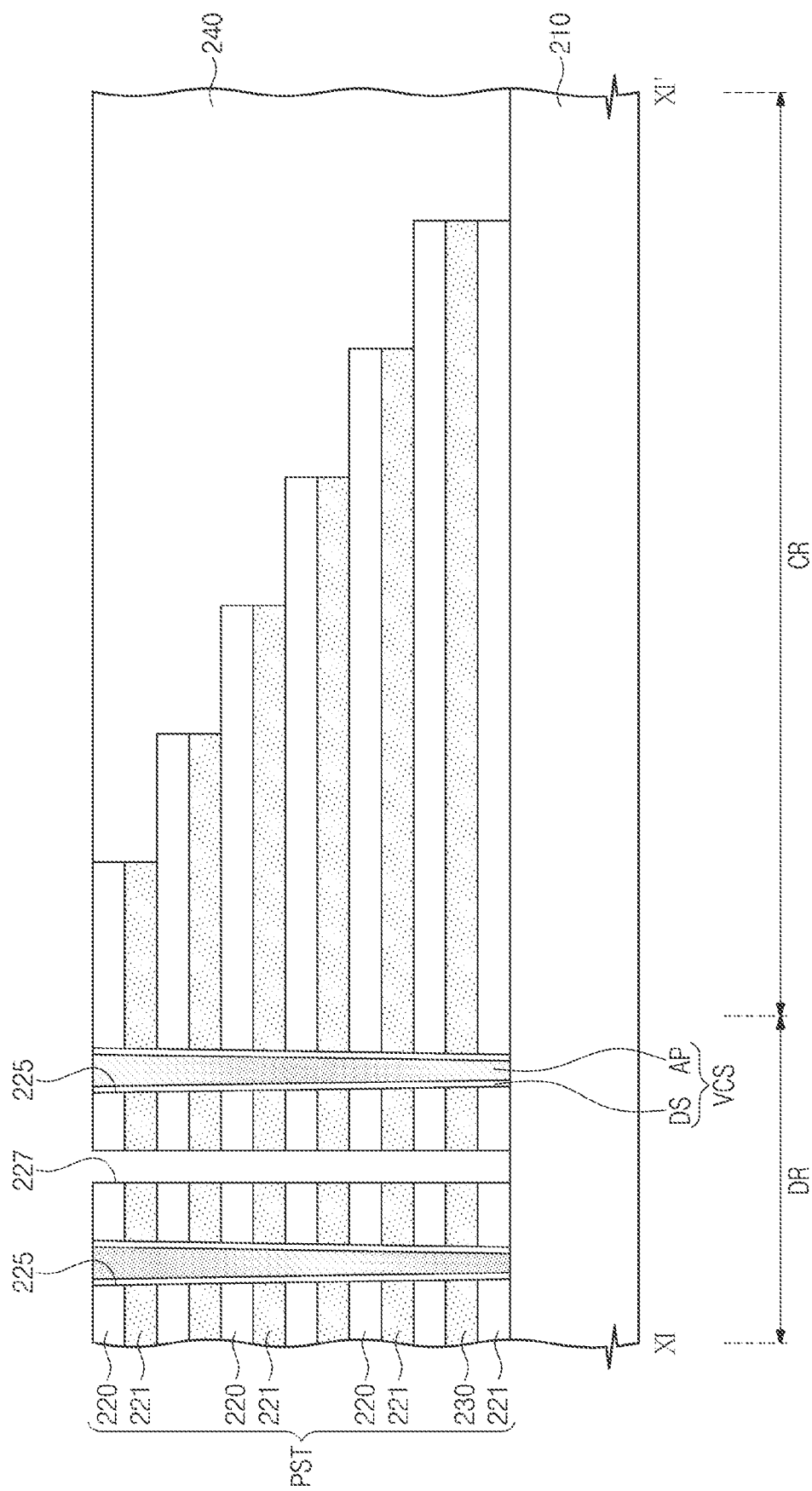

Referring to FIGS. 10 and 11E, the insulating layers 220 and the sacrificial layers 221 alternately stacked may be patterned to form isolation trenches 227 extending in the first direction D1. The isolation trenches 227 may expose the substrate 210. The insulating layers 220 and the sacrificial layers 221 alternately stacked may be divided into a plurality of preliminary stack structures PST by the isolation trenches 227.

Figure 11F:
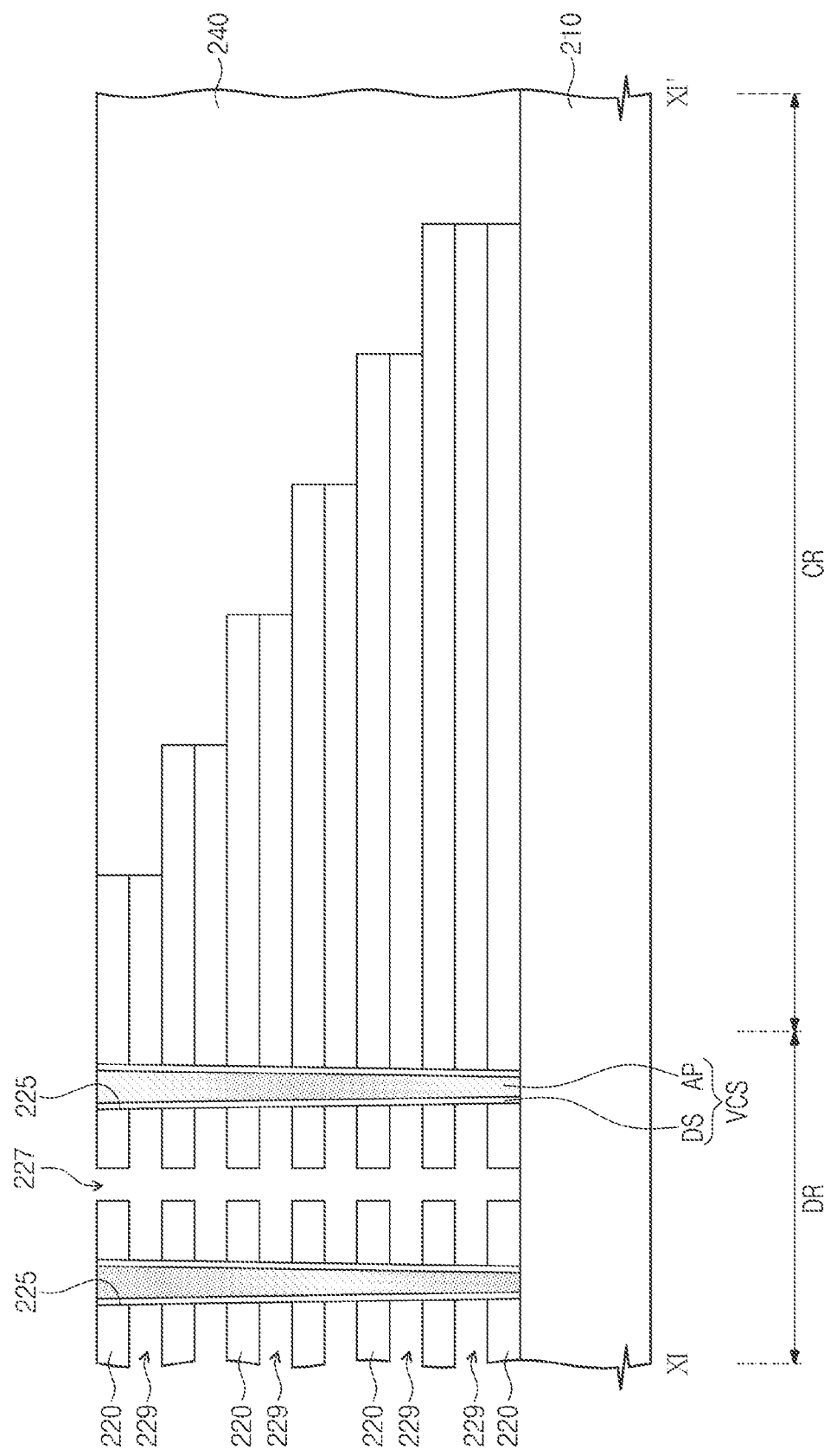

Referring to FIGS. 10 and 11F, the sacrificial layers 221 exposed by the isolation trenches 227 may be removed to form electrode regions 229. The electrode regions 229 may correspond to empty regions formed by the removal of the sacrificial layers 221 and may be defined by the vertical channel structures VCS, the insulating layers 220 and the filling insulation layer 240. If each of the sacrificial layers 221 includes a silicon nitride layer or a silicon oxynitride layer, the removal process of the sacrificial layers 221 may be performed using an etching solution including phosphoric acid.

Figure 11G:
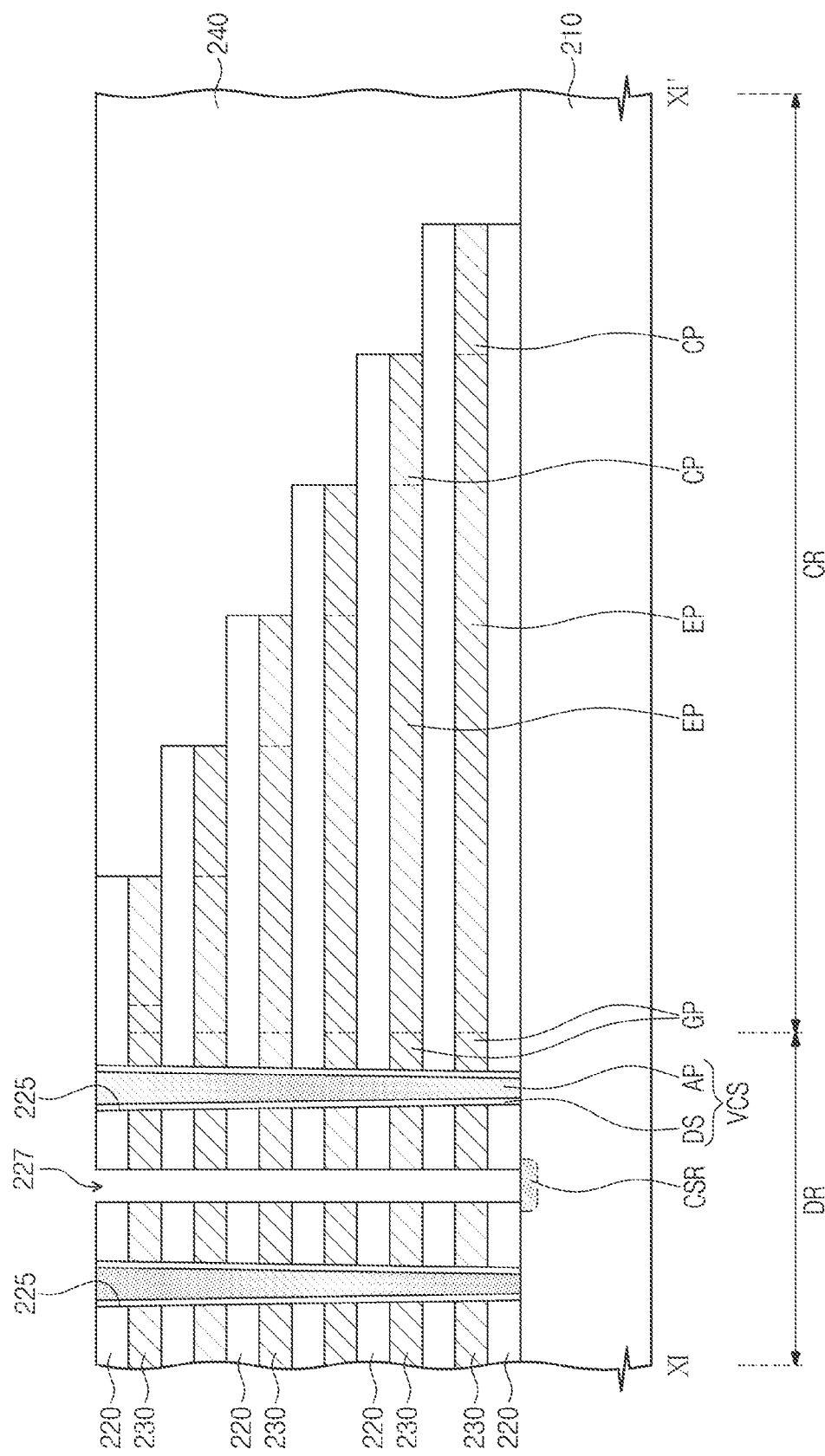

Referring to FIGS. 10 and 11G, a conductive layer (not shown) may be formed in the electrode regions 229 through the isolation trenches 227. The conductive layer (not shown) may include at least one of poly-crystalline silicon doped with dopants, a metal (e.g., tungsten, copper, or aluminum), a conductive metal nitride (e.g., titanium nitride or tantalum nitride), or a transition metal (e.g., titanium or tantalum). The conductive layer (not shown) may be formed by an ALD method.

Subsequently, the conductive layer formed outside the electrode regions 229 (e.g., the conductive layer formed in the isolation trenches 227) may be removed to form electrodes 230 in the electrode regions 229, respectively. The conductive layer formed in the isolation trenches 227 may be removed to expose the substrate 210. Dopant ions of a second conductivity type (e.g., a N-type) may be provided into the exposed substrate 210 at a high dose, so common source regions CSR may be formed under the isolation trenches 227, respectively.

Each of the electrodes 230 may include a gate portion GP, a contact portion CP, and an extension portion EP connected between the gate portion GP and the contact portion CP. The gate portion GP may be provided on the device region DR. The extension portion EP and the contact portion CP may be provided on the connection region CR. The electrodes 230 may have a stepwise structure on the connection region CR, like the sacrificial layers 221 described with reference to FIG. 11B. In other words, lengths of the electrodes 230 in the first direction D1 may be sequentially reduced as a distance from the substrate 210 increases. That is, lengths of the extension portions EP in the first direction D1 may be sequentially reduced as a distance from the substrate 210 increases. Thus, the contact portion CP of each of the electrodes 230 may be exposed by other electrodes 230.

Figure 11H:
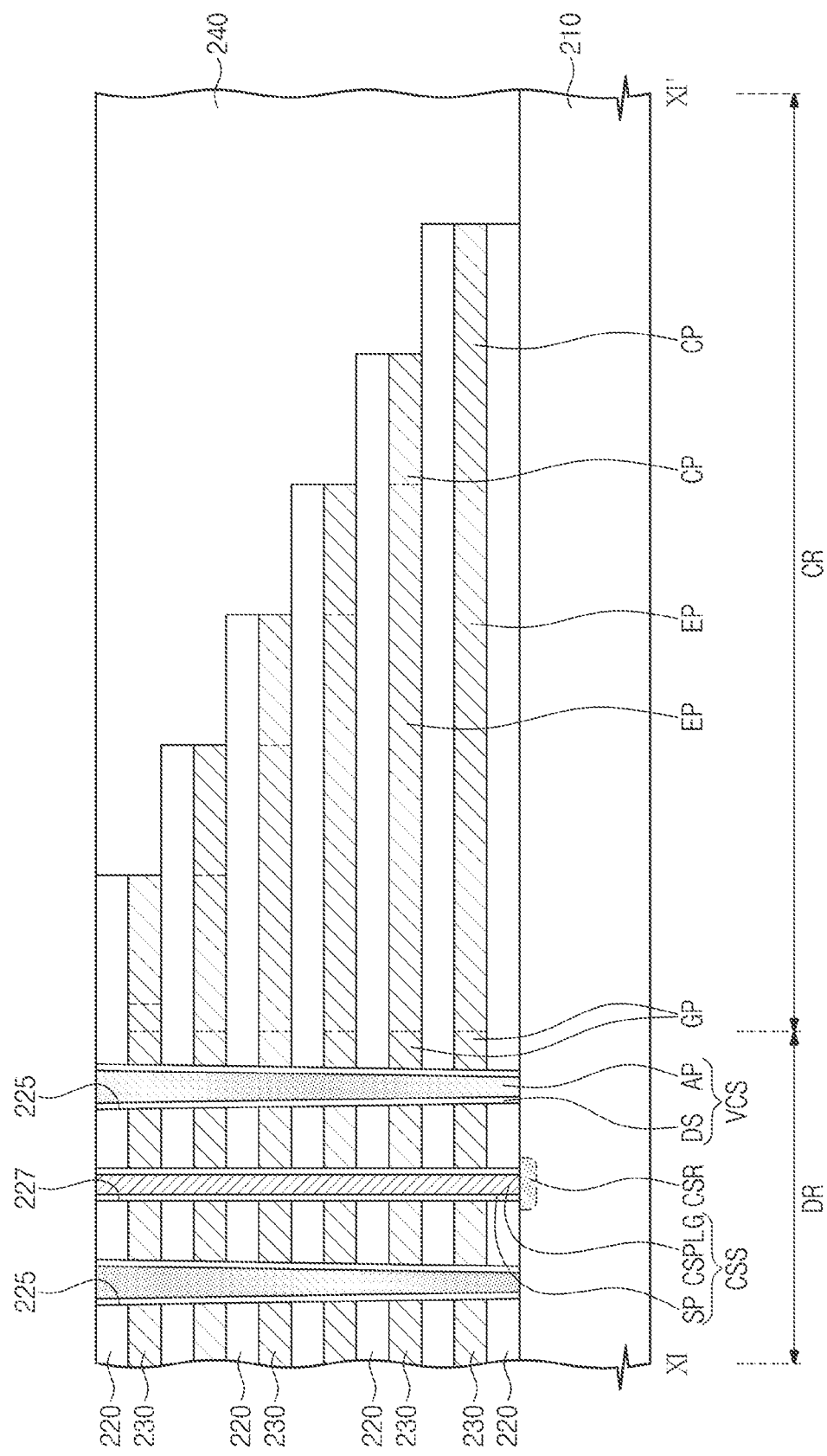

Referring to FIGS. 10 and 11H, common source structures CSS may be formed in the isolation trenches 227. Each of the common source structures CSS may include a sidewall insulating spacer SP and a common source plug CSPLG. In example embodiments, a silicon oxide layer or silicon nitride layer may be deposited on the substrate 210, and an anisotropic etching process may be performed on the silicon oxide layer or silicon nitride layer to form the sidewall insulating spacer SP. The common source plug CSPLG may be formed to fill a space between the sidewall insulating spacers SP in the isolation trench 227. For example, the common source plug CSPLG may be formed using a CVD method. The common source plug CSPLG may include at least one of a metal (e.g., tungsten, copper, or aluminum), a conductive metal nitride (e.g., titanium nitride or tantalum nitride), or a transition metal (e.g., titanium or tantalum). The common source plug CSPLG may be electrically connected to the common source region CSR.

Figure 11I:
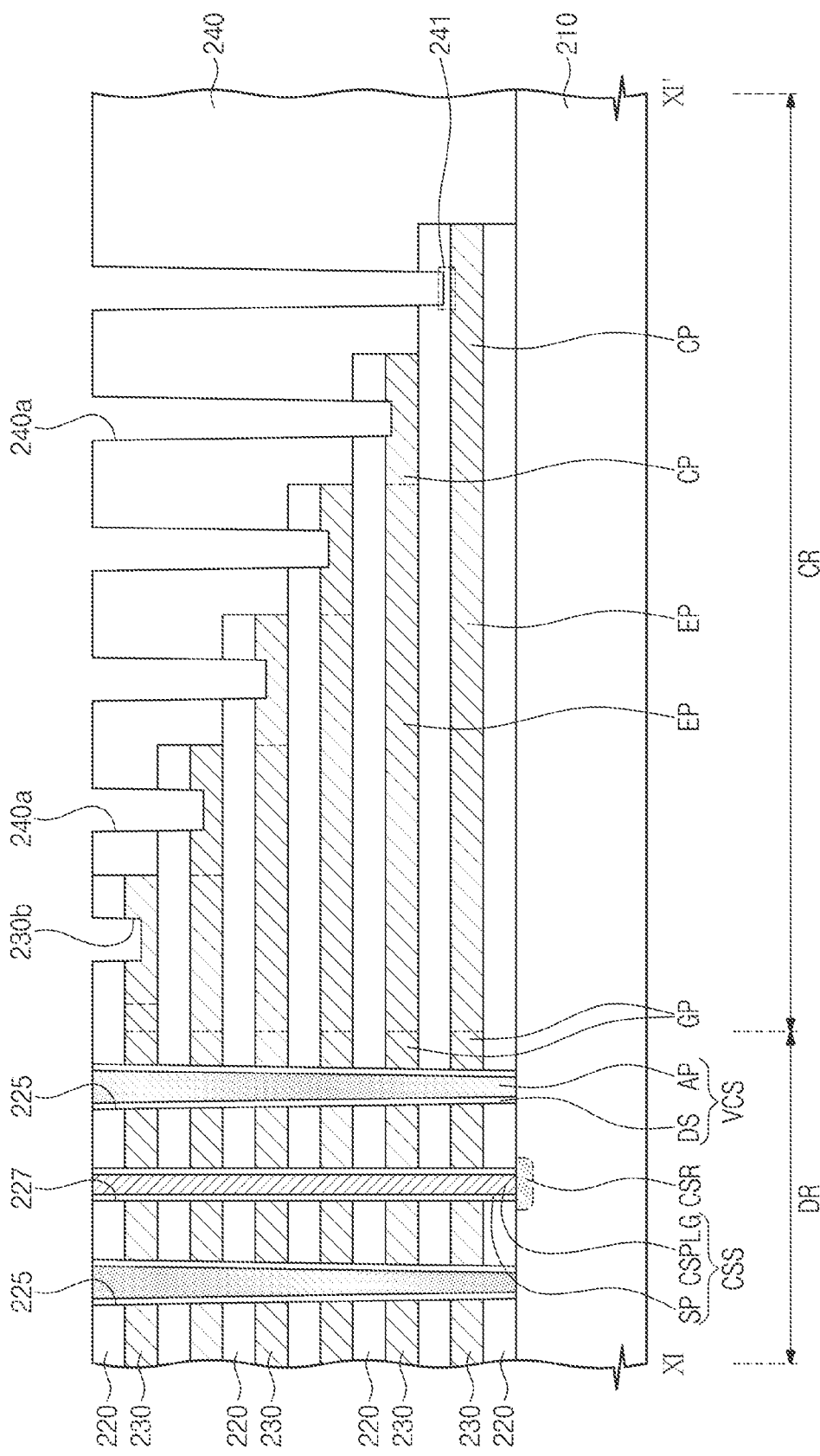

Referring to FIGS. 10 and 11I, contact holes 240a may be formed in the insulating layers 220 and the filling insulation layer 240. The contact holes 240 may penetrate the insulating layers 220 and the filling insulation layer 240 so as to be adjacent to the contact portions CP of the electrodes 230, respectively. In example embodiments, a mask (not shown) exposing portions of the filling insulation layer 240 may be formed on the filling insulation layer, and the filling insulation layer 240 and the insulating layers 220 may be etched using the mask as an etch mask to form the contact holes 240a. At this time, the filling insulation layer 240 and the insulating layers 220 may be etched by a dry etching process, and etch rates of the filling insulation layer 240 and the insulating layers 220 may be higher than that of the electrodes 220 during the dry etching process.

The contact portions CP of the electrodes 230 may be sequentially exposed from the contact portion CP of the uppermost electrode 230 to the contact portion CP of the lowermost electrode 230 through the contact holes 240a during the etching process. As the etching process may be continuously performed, recess regions 230b in the contact portions CP of the electrodes 230 may be formed. Depths of the recess regions 230b may sequentially increase as a distance from the substrate 210 increases. The etching process may be performed until a bottom surface of the contact hole 240a corresponding to the lowermost electrode 230 is adjacent to the contact portion CP of the lowermost electrode 230. A process time of the etching process may be controlled to adjust the depth of the contact hole 240a adjacent to the contact portion CP of the lowermost electrode 230. If the process time of the etching process is long enough, the contact portion CP of the lowermost electrode 230 may be exposed through the contact hole 240a. In this case, the contact hole 240a may sometimes penetrate the uppermost electrode 230. Thus, the etching process may not be performed for a long process time. As a result, as illustrated in 11I, the contact portion CP of the lowermost electrode 230 may not be exposed through the contact hole 240a. In other words, a residue 241 of the filling insulation layer 240 and/or the insulating layer 220 may remain on the contact portion CP of the lowermost electrode 230 which is disposed under the contact hole 240a.

Figure 11J:
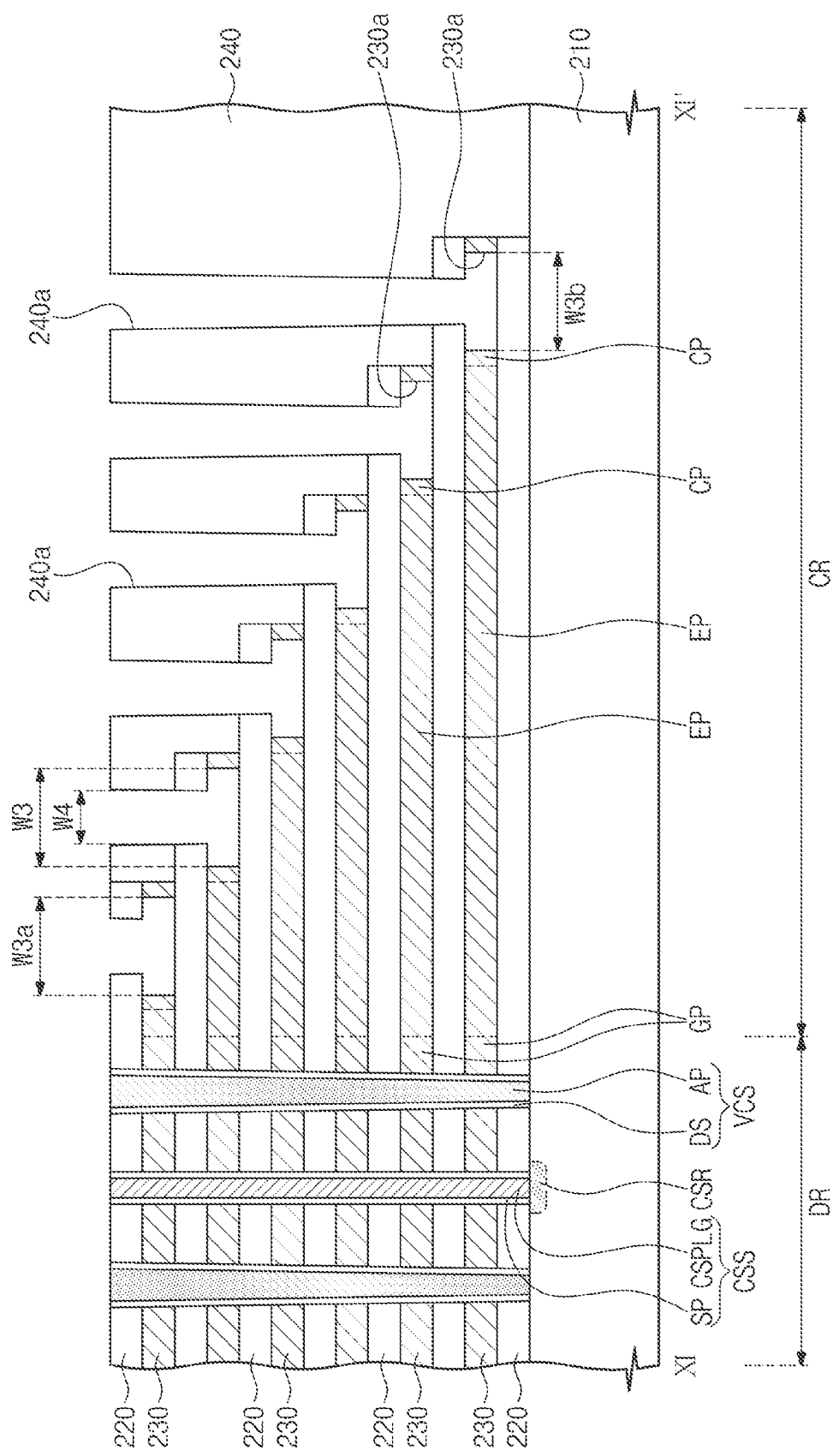

Referring to FIGS. 10 and 11J, portions of the contact portions CP of the electrodes 230 which are adjacent to the contact holes 240a may be removed to form openings 230a in the contact portions CP of the electrodes 230, respectively. The openings 230a may be formed by performing a wet etching process which has an etch rate of the electrodes 230 higher than those of the filling insulation layer 240 and the insulating layers 220. The filling insulation layer 240 and the insulating layers 220 may be partially etched by the wet etching process. Thus, the filling insulation layer 240 and the insulating layers 220 of inner sidewalls of the contact holes 240a may be etched to increase widths of the contact holes 240a.

If the contact portions CP of the electrodes 230 are exposed through the contact holes 240a, the electrodes 230 may be etched from their exposed portions. Thus, each of the openings 230a may extend from a top surface to a bottom surface of the electrode 230 corresponding thereto. In addition, a planar cross section of the opening 230a may have a circular shape with the contact hole 240a as its center. Each of the openings 230a may be connected to a corresponding one of the contact holes 240a.

If the residue 241 remains on the contact portion CP of the lowermost electrode 230 under the contact hole 240a as illustrated in FIG. 11I, the residue 241 of FIG. 11I may be removed by the wet etching process. In this case, since a substantial etching time of the lowermost electrode 230 is shorter than that of the uppermost electrode 230, a width W3a of the opening 230a of the uppermost electrode 230 may be greater than a width W3b of the opening 230a of the lowermost electrode 230. The residue 241 of FIG. 11I may be removed, so the contact hole 240a may extend to a top surface of the contact portion CP of the lowermost electrode 230. In other words, the contact portion CP of the lowermost electrode 230 may be exposed through the contact hole 240a. The exposed portion of the lowermost electrode 230 may be etched by the wet etching process. As a result, each of the openings 230a may extend from the top surface to the bottom surface of the corresponding electrode 230, and the planar cross section of each of the openings 230a may have the circuit shape with the contact hole 240a as its center. Each of the openings 230a may be connected to the corresponding one of the contact holes 240a.

A process time of the wet etching process may be controlled to adjust sizes of the opening 230a. In other words, the etched amounts of the electrodes 230 may be increased as the process time of the wet etching process is increased, so the sizes of the opening 230a may be increased. Thus, if the process time of the wet etching process is long enough, a width W3 of the opening 230a may be greater than a width W4 of the contact hole 240a corresponding thereto.

Figure 11K:
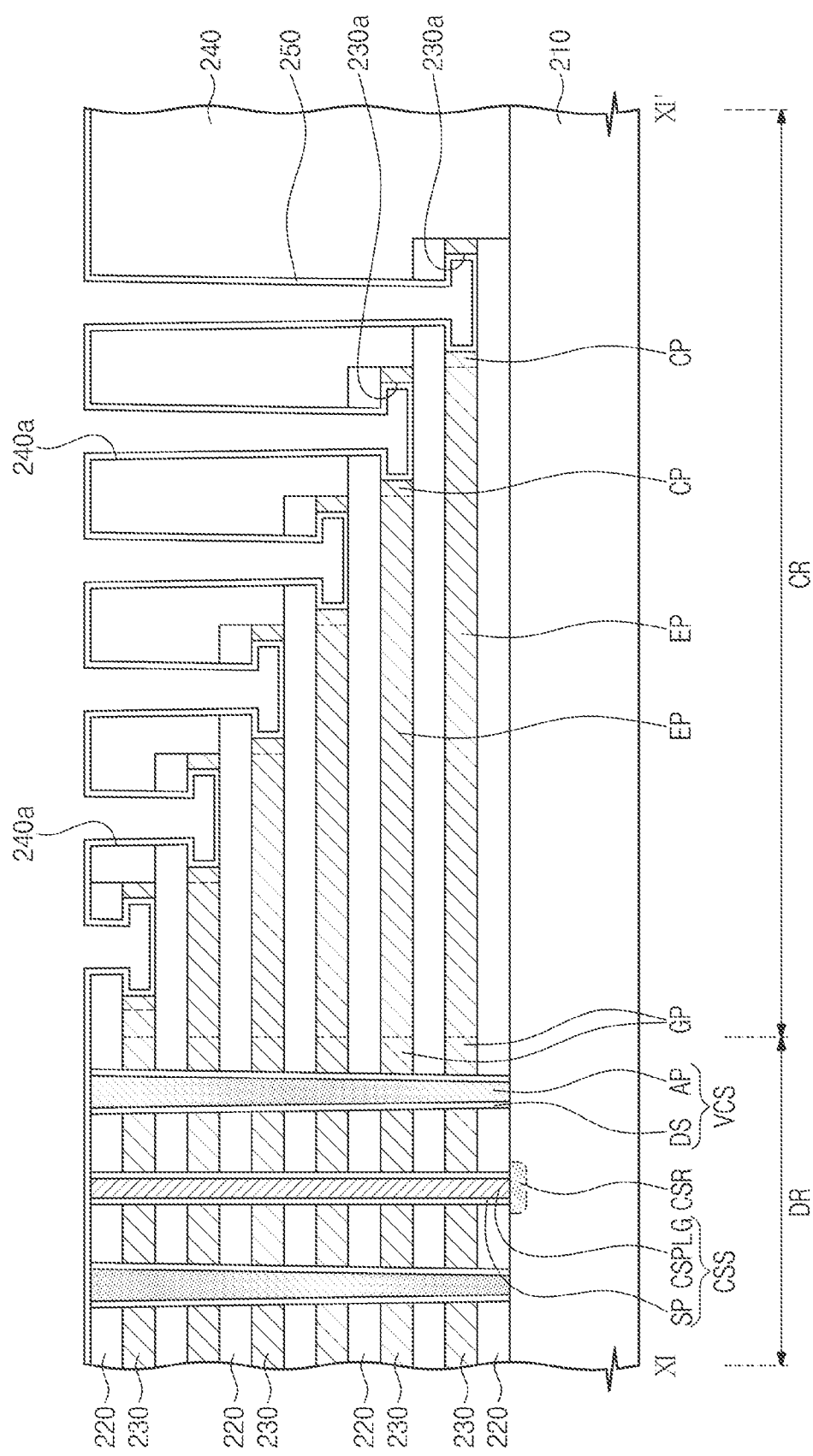

Referring to FIGS. 10 and 11K, a barrier layer 250 may be formed to conformally cover inner surfaces of the openings 230a and the contact holes 240a. The barrier layer 250 may be formed by, for example, a CVD method. The barrier layer 250 may include a conductive metal nitride (e.g., titanium nitride or tantalum nitride).

Figure 11L:
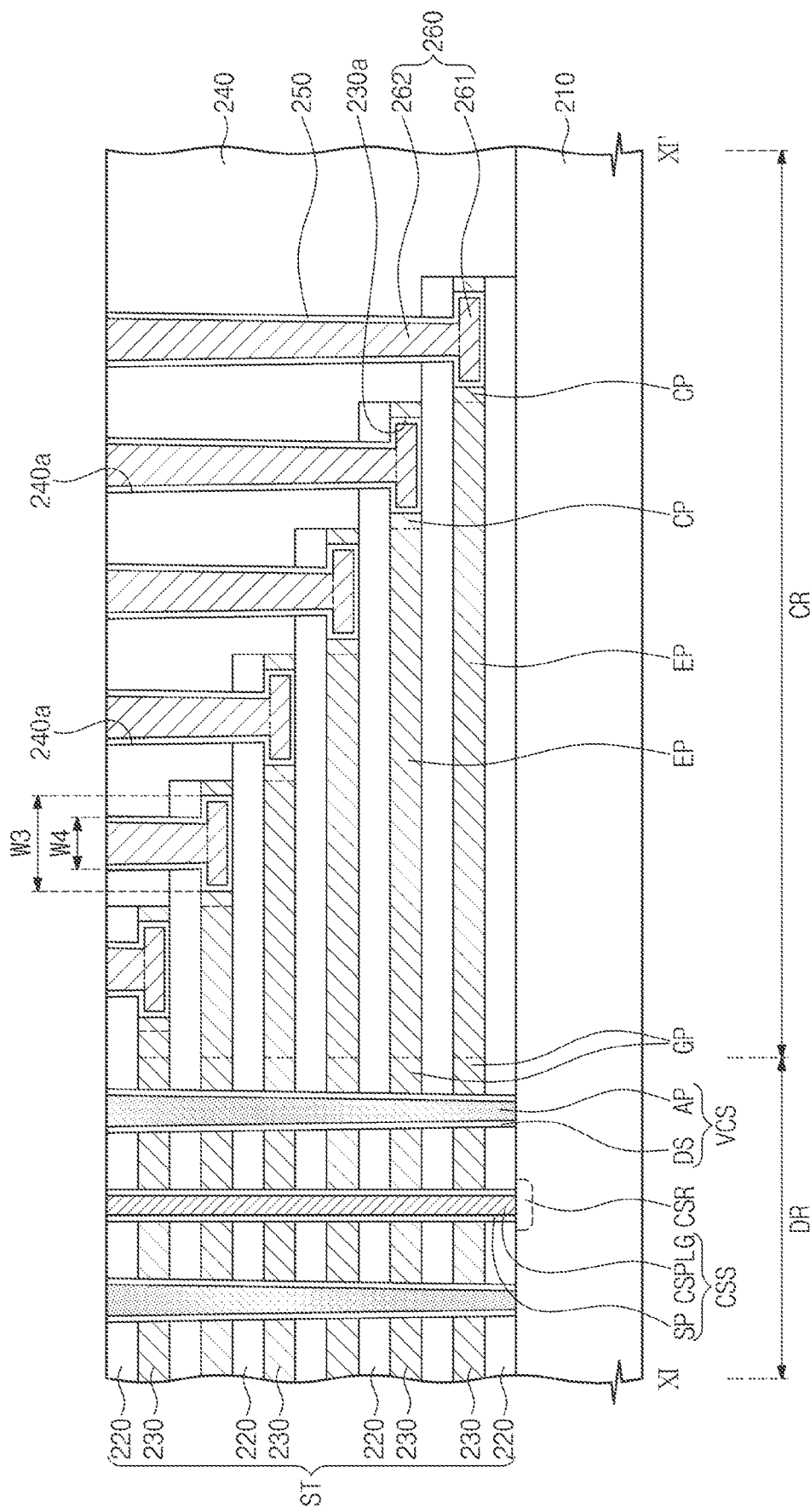
Figure 11M:
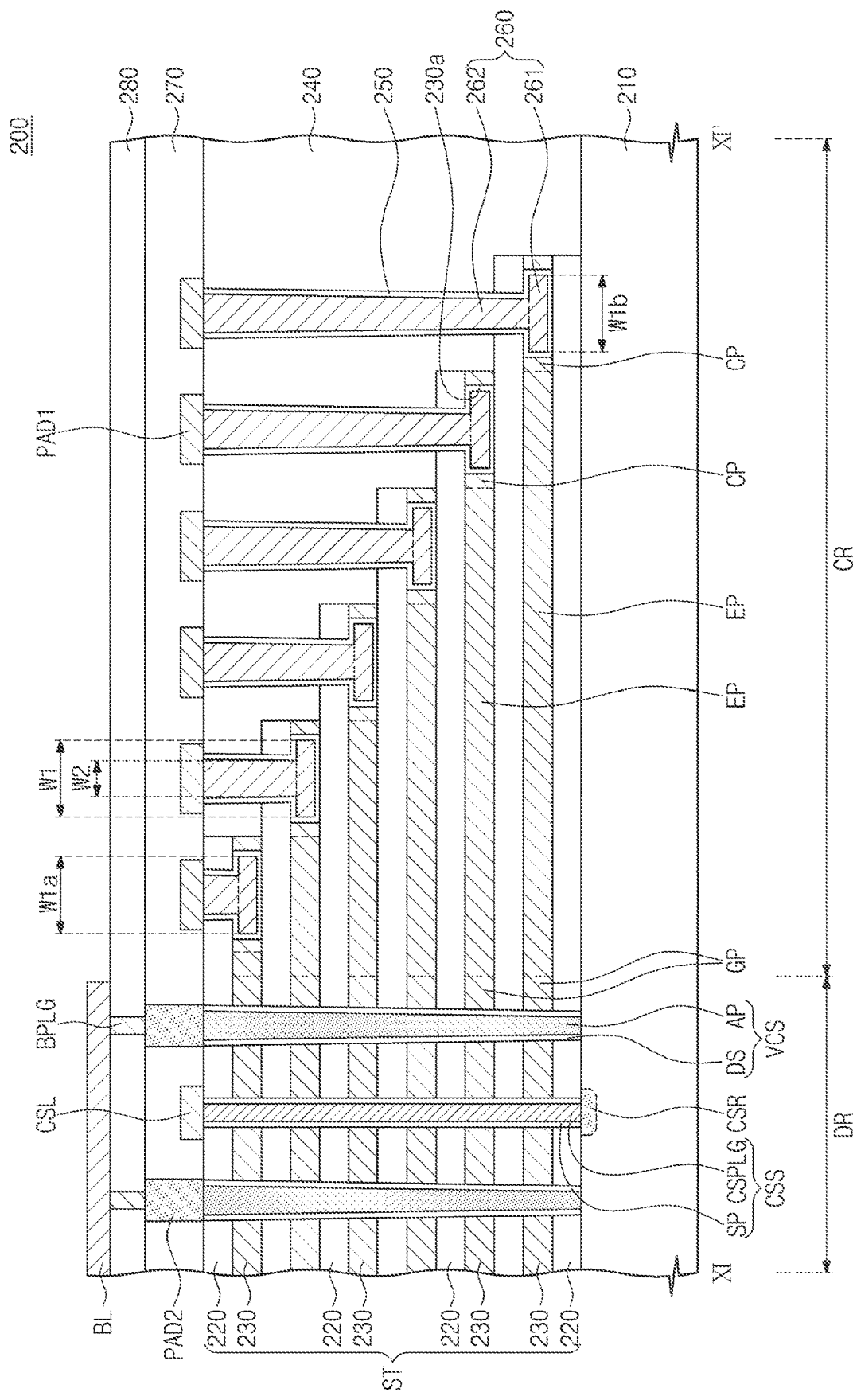
FIG. 11M is a cross-sectional view taken along a line XI-XI' of FIG. 10.

Referring to FIGS. 10 and 11L, contact plugs 260 may be formed to fill the openings 230a and the contact holes 240a. In example embodiments, a conductive layer may be formed to fill the openings 230a and the contact holes 240a, and the conductive layer and the barrier layer 250 may be planarized until the filling insulation layer 240 and the uppermost insulating layer 220 are exposed, thereby forming the contact plugs 260. The conductive layer may be formed using, for example, a CVD method. Each of the contact plugs 260 may include a contact plate 261 corresponding to a portion filling the opening 230a, and a contact body 262 corresponding to a portion filling the contact hole 240a. Since the opening 230a is connected to the contact hole 240a, a bottom surface of the contact body 262 may be in contact with a top surface of the contact plate 261. The contact plate 261 may be electrically connected to the electrode 230 through the barrier layer 250. The contact plate 261 may have a circular plate structure because of the shape of the opening 230a and may penetrate a corresponding electrode 230. Since the width of the opening 230a is greater than the width of the contact hole 240a, a width W1 of the top surface of the contact plate 261 may be greater than a width W2 of the bottom surface of the contact body 262. The contact plate 261 and the contact body 262 may include the same material. For example, the contact plate 261 and the contact body 262 may include at least one of a metal (e.g., tungsten, copper, or aluminum), a conductive metal nitride (e.g., titanium nitride or tantalum nitride), or a transition metal (e.g., titanium or tantalum).

According to example embodiments of inventive concepts, even though the residue 241 of FIG. 11I remains on the electrodes 230 (e.g., the lowermost electrode 230) under the contact holes 240a by an insufficient etching time or uniformity of the etching process, the residue 241 of FIG. 11I may be removed by the wet etching process. Thus, the contact plugs 260 may be in stable contact with the electrodes 230.

In addition, if the process time of the dry etching process is excessively increased to expose the lowermost electrode 230 during the formation of the contact holes 240a, the uppermost electrode 230 may be penetrated by the contact hole 240a to cause an electrical short between electrodes. However, according to example embodiments, it is not required to excessively increase the process time of the dry etching process to expose the lowermost electrode 230. Thus, the electrical short between electrodes may be limited and/or prevented.

Referring again to FIGS. 10 and 11M, a common source line CSL and first pads PAD1 may be formed on the filling insulation layer 240. The common source line CSL may be connected to the common source plug CSPLG, and the first pads PAD1 may be connected to the contact plugs 260.

Next, a first capping insulating layer 270 may be formed to cover the common source line CSL and the first pads PAD1. The first capping insulating layer 270 may include a silicon oxide layer and/or a silicon nitride layer. Second pads PAD2 may be formed to penetrate the first capping insulating layer 270. The second pads PAD2 may be electrically connected to the active pillars AP.

Subsequently, a second capping insulating layer 280 may be formed on the first capping insulating layer 270, and bit line plugs BPLG may be formed to penetrate the second capping insulating layer 280. The bit line plugs BPLG may be electrically connected to the second pads PAD2. Bit lines BL may be formed on the second capping insulating layer 280 so as to be connected to the bit line plugs BPLG. Each of the bit lines BL may be connected to the bit line plugs BPLG arranged in the second direction D2. The bit lines BL and the bit line plugs BPLG may include at least one of a metal (e.g., tungsten, copper, or aluminum), a conductive metal nitride (e.g., titanium nitride or tantalum nitride), or a transition metal (e.g., titanium or tantalum).

Figure 12:
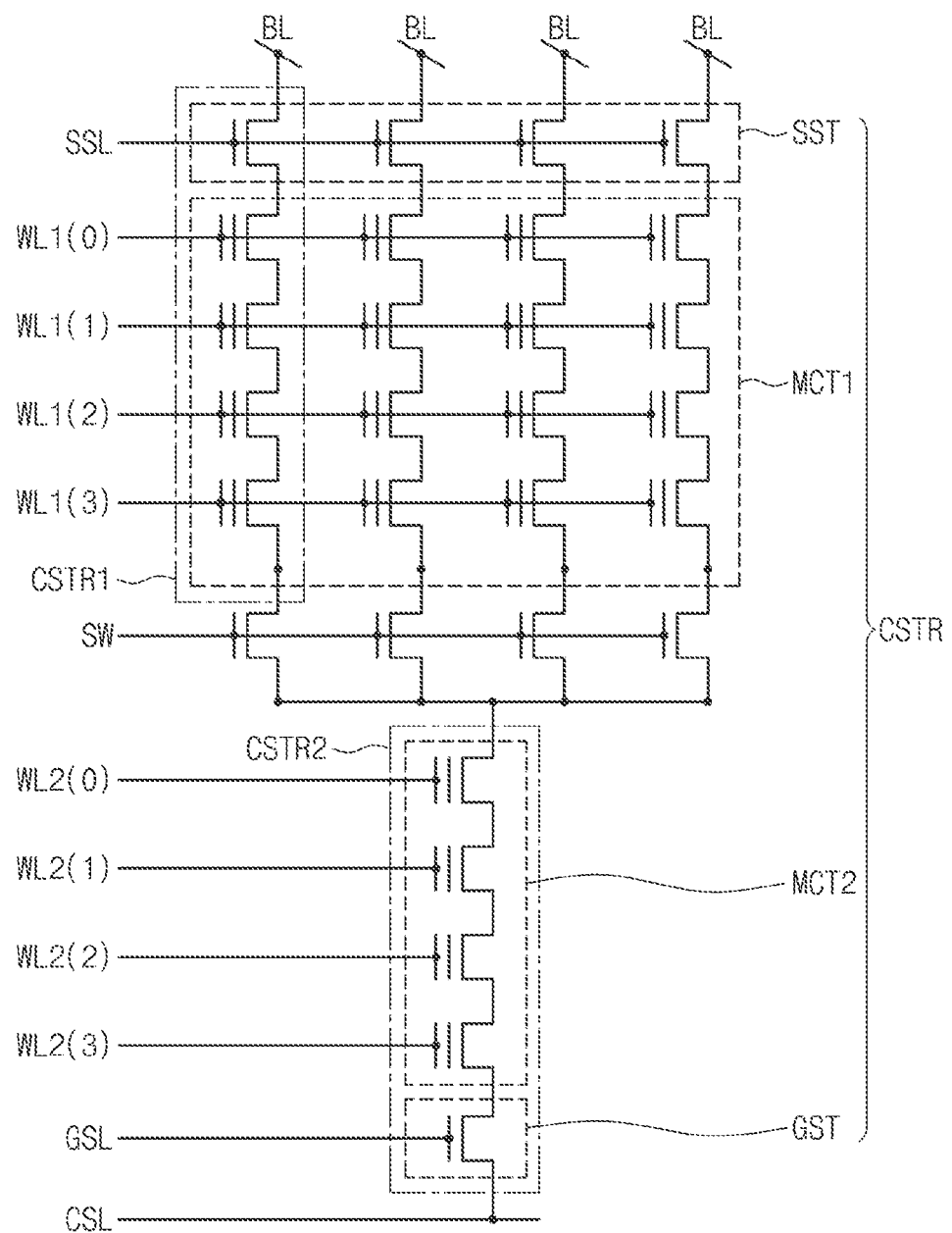
FIG. 12 is a schematic circuit diagram illustrating a cell array of a memory block of FIG. 8 according to example embodiments of inventive concepts.

FIG. 12 is a schematic circuit diagram illustrating a cell array of a memory block of FIG. 8 according to example embodiments of inventive concepts.

Referring to FIG. 12, a cell array of a semiconductor device according to example embodiments may include a common source line CSL, a plurality of bit lines BL, and a cell string CSTR between the common source line CSL and the bit lines BL.

The common source line CSL may be a conductive layer disposed on a substrate, and the bit lines BL may be conductive patterns (e.g., metal lines) disposed on the substrate.

The cell string CSTR may include a plurality of upper strings CSTR1 respectively connected to the bit lines BL and a single lower string CSTR2 connected to the common source line CSL. The plurality of upper strings CSTR1 may be connected in common to the single lower string CSTR2. The upper strings CSTR1 may be connected in common to the lower string CSTR2 through switching elements SW. The switching elements SW connected to the upper strings CSTR1 may be electrically controlled to be supplied with the same voltage.

Each of the upper strings CSTR1 may include a string selection transistor SST connected to each of the bit lines BL and a plurality of upper memory cell transistors MCT1 disposed between the string selection transistor SST and the switching element SW. The string selection transistor SST and the upper memory cell transistors MCT1 may be connected in series to each other. The lower string CSTR2 may include a ground selection transistor GST connected to the common source line CSL and a plurality of lower memory cell transistors MCT2 disposed between the ground selection transistor GST and the switching elements SW. The ground selection transistor GST and the lower memory cell transistors MCT2 may be connected in series to each other.

A string selection line SSL and upper word lines WL1(0) to WL1(3) which are disposed between the bit lines BL and the switching elements SW may be used as gate electrodes of the string selection transistor SST and the upper memory cell transistors MCT1, respectively. A ground selection line GSL and lower word lines WL2(0) to WL2(3) which are disposed between the common source lines CSL and the switching elements SW may be used as gate electrodes of the ground selection transistor GST and the lower memory cell transistors MCT2, respectively. Each of the upper and lower memory cell transistors MCT1 and MCT2 may include a data storage element.

The plurality of upper strings CSTR1 respectively connected to the bit lines BL may be connected in common to the single lower string CSTR2 connected to the common source line CSL. Thus, the upper strings CSTR1 which include the string selection transistors SST respectively connected to the bit lines BL may share the ground selection transistor GST included in the single lower string CSTR2. In other words, the upper strings CSTR1 which are connected to different bit lines BL and are operated independently of each other may be connected in common to the single lower string CSTR2 to share the ground selection transistor GST, so a highly integrated semiconductor device may be realized.

Figure 13:
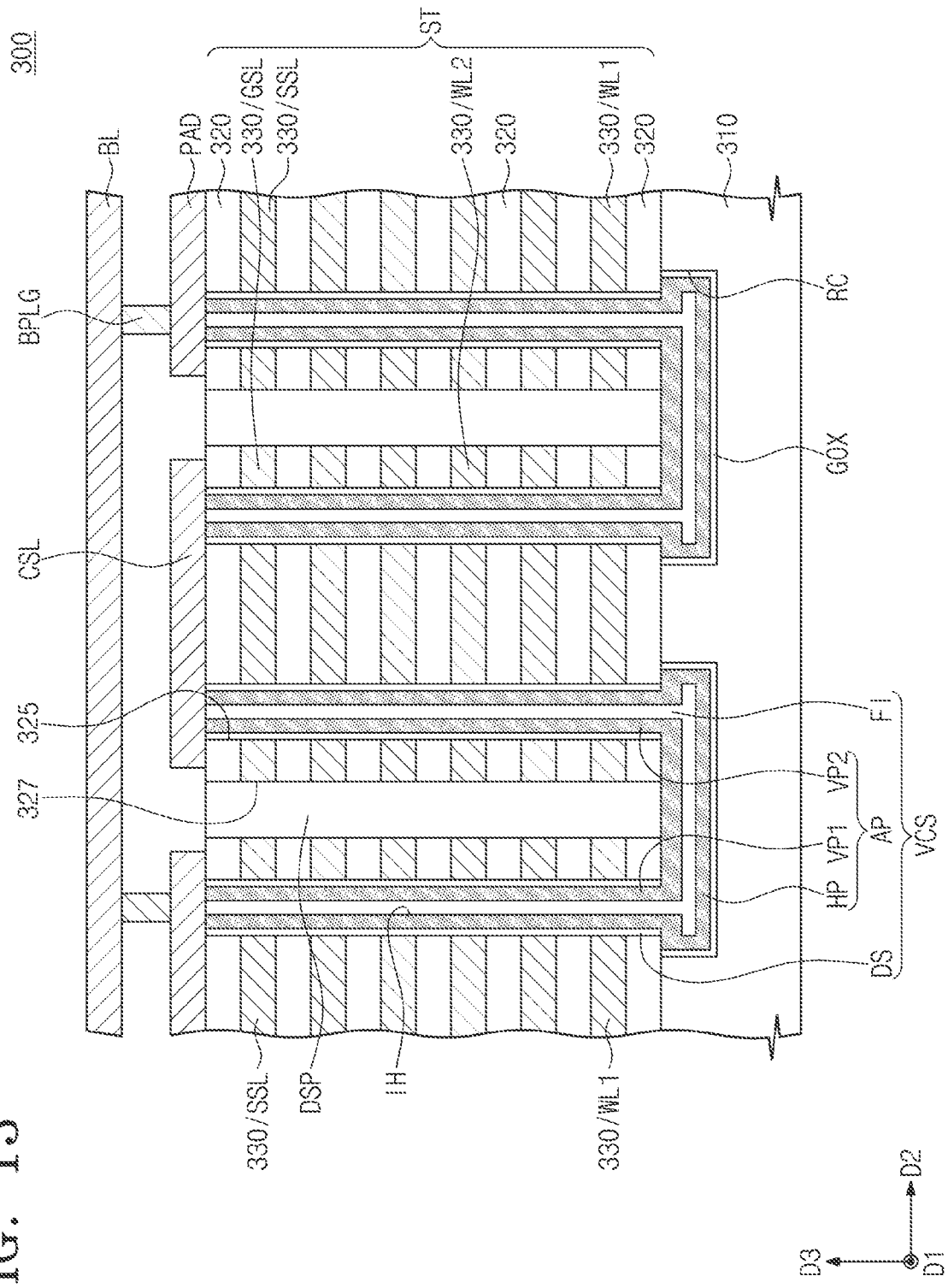
FIG. 13 is a cross-sectional view illustrating a semiconductor device according to example embodiments of inventive concepts.

FIG. 13 is a cross-sectional view illustrating a semiconductor device according to example embodiments of inventive concepts. FIG. 13 illustrates a region corresponding to the device region DR of the semiconductor device described with reference to FIGS. 10 and 11M. A semiconductor device according to example embodiments of inventive concepts will be described hereinafter.

Referring to FIG. 13, a semiconductor device 300 according to example embodiments of inventive concepts may include a substrate 310, bit lines BL on the substrate 310, stack structures ST between the substrate 310 and the bit lines BL, a common source line CSL between the stack structures ST and the bit lines BL, and vertical channel structures VCS penetrating the stack structures ST. The stack structure ST may include a plurality of insulating layers 320 and a plurality of electrodes 330 which are alternately stacked. Each of the vertical channel structures VCS may include an active pillar AP, a data storage layer DS, and a filling insulating pattern FI. The active pillar AP may be connected between the bit line BL and the common source line CSL. Bit line plugs PLG and pads PAD may be further provided between the stack structures ST and the bit lines BL to electrically connect the bit lines BL to the active pillars AP.

The stack structures ST may extend in a first direction D1. The stack structures ST may be spaced apart from each other in a second direction D2 intersecting (e.g., perpendicular to) the first direction D1 by isolation trenches 327 extending in the first direction D1. The stack structure ST may include the insulating layers 320 and the electrodes 330 which are alternately stacked. The electrodes 330 may include at least one of doped silicon, a metal (e.g., tungsten), a metal nitride, or a metal silicide. The insulating layers 320 may be silicon oxide layers.

The electrodes 330 may be sequentially stacked on the substrate 310 in a direction (e.g., a third direction D3) perpendicular to a top surface of the substrate 310. The electrodes 330 may include a string selection line SSL, word lines WL1 and WL2, and a ground selection line GSL. The string selection line SSL may be disposed between the word lines WL1 and the bit lines BL. The ground selection line GSL may be disposed between the common source line CSL and the word lines WL2. The word lines WL1 and WL2 may be sequentially stacked on the substrate 110. The string selection line SSL and the ground selection line GSL may be disposed on the word lines WL1 and WL2. The string selection line SSL and the ground selection GSL may be spaced apart from each other in the second direction D2 by the isolation trench 327. The word lines WL1 and WL2 may include upper word lines WL1 disposed between the substrate 310 and the string selection line SSL and lower word lines WL2 disposed between the substrate 310 and the ground selection line GSL. The upper word lines WL1 may be spaced apart from the lower word lines WL2 in the second direction D2 by the isolation trench 327.

A device isolation pattern DSP may be provided between the string selection line SSL and the ground selection line GSL and between the upper word lines WL1 and the lower word lines WL2. The device isolation pattern DSP may have a line shape extending in the first direction D1 when viewed from a plan view. The device isolation pattern DSP may fill the isolation trench 327 and may include at least one of a silicon oxide layer, a silicon nitride layer, or a silicon oxynitride layer.

A plurality of the active pillars AP may penetrate the stack structure ST. The active pillars AP may be arranged in a line form or a zigzag form along the first direction D1 when viewed from a plan view.

Each of the active pillars AP may include vertical portions VP1 and VP2 penetrating the stack structures ST, and a horizontal portion HP disposed under the stack structures ST to connect the vertical portions VP1 and VP2 to each other. The vertical portions VP1 and VP2 may be provided in vertical holes 325 penetrating the stack structures ST. The horizontal portion HP may be provided in a horizontal recess portion RC that is formed in an upper portion of the substrate 310. One of the vertical portions VP1 and VP2 may be connected to the common source line CSL, and the other of the vertical portions VP1 and VP2 may be connected to one of the bit lines BL. The horizontal portion HP may be provided between the substrate 310 and the stack structures ST to connect the vertical portions VP1 and VP2 to each other.

In more detail, the vertical portions VP1 and VP2 of each of the active pillars AP may include a first vertical portion VP1 penetrating the upper word lines WL1 and the string selection line SSL, and a second vertical portion VP2 penetrating the lower word lines WL2 and the ground selection line GSL. The first vertical portion VP1 may be connected to one of the bit lines BL, and the second vertical portion VP2 may be connected to the common source line CSL. The horizontal portion HP may extend from under the upper word lines WL1 to under the lower word lines WL2 to connect the first vertical portion VP1 to the second vertical portion VP2.

Each of the active pillars AP may have a hollow cylindrical shape (e.g., a macaroni shape), so it may have an inner hole IH. The inner hole IH of the active pillar AP may be filled with the filling insulating pattern FI. The filling insulating pattern FI may be formed of a silicon oxide layer.

The data storage layer DS may be provided between each of the active pillars AP and the electrodes 330. A gate insulating layer GOX may be provided between the active pillar AP (e.g., the horizontal portion HP) and the substrate 310. The gate insulating layer GOX may be formed of a silicon oxide layer.

The substrate 310 according to example embodiments may also include a connection region (not shown). The stack structures ST extending in the first direction D1 may extend on the connection region. Portions of the stack structures ST on the connection region may have the substantially same structure as those on the connection region CR described with reference to FIGS. 10 and 11M. Each of the electrodes 330 extending in the first direction D1 may include a contact portion and an extension portion extending from the device region so as to be connected to the contact portion. The electrodes 330 may have a stepwise structure on the connection region, so the contact portions of the electrodes 330 may be exposed. A filling insulation layer (not shown) may be provided on the connection region to cover end portions of the electrodes 330. The contact portion of each of the electrodes 330 may have an opening (not shown) which extends from a top surface to a bottom surface thereof. A planar cross section of the opening may have a circular shape. Contact plugs (not shown) may be disposed on the connection region. Each of the contact plugs may include a contact plate and a contact body. The contact plate may be inserted into the opening of each of the electrodes 330 so as to be electrically connected to each of the electrodes 330. The contact plate may have a circular plate structure and may penetrate the corresponding electrode 330 by filling the opening. A bottom surface of the contact body may be in contact with a top surface of the contact plate. A width of the top surface of the contact plate may be greater than a width of the bottom surface of the contact body. The contact body may vertically extend from the top surface of the contact plate to penetrate the filling insulation layer. A barrier layer (not shown) may conformally cover a surface of the contact plate and a sidewall of the contact body connected to the contact plate.

Figure 14:
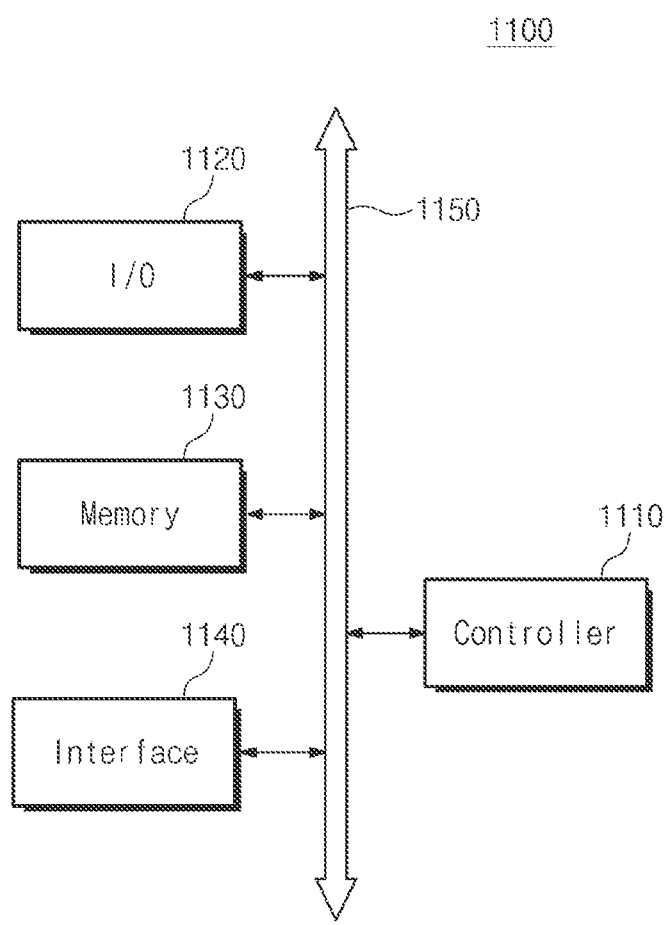
FIG. 14 is a schematic block diagram illustrating an example of an electronic system including a semiconductor device according to example embodiments of inventive concepts.

FIG. 14 is a schematic block diagram illustrating an example of an electronic system including a semiconductor device according to example embodiments of inventive concepts.

Referring to FIG. 14, an electronic system 1100 according to example embodiments of inventive concepts may include a controller 1110, an input/output (I/O) unit 1120, a memory device 1130, an interface unit 1140, and a data bus 1150. At least two of the controller 1110, the I/O unit 1120, the memory device 1130, and the interface unit 1140 may communicate with each other through the data bus 1150. The data bus 1150 may correspond to a path through which electrical data are transmitted. The memory device 1130 may include at least one of the semiconductor devices according to the aforementioned example embodiments of inventive concepts.

The controller 1110 may include at least one of a microprocessor, a digital signal processor, a microcontroller, or other logic devices having a similar function to any one thereof. The I/O unit 1120 may include a keypad, a keyboard and/or a display device. The memory device 1130 may store data and/or commands. The interface unit 1140 may transmit electrical data to a communication network or may receive electrical data from a communication network. The interface unit 1140 may operate by wireless or cable. For example, the interface unit 1140 may include an antenna or a cable/wireless transceiver. Although not shown in the drawings, the electronic system 1100 may further include a fast dynamic random access memory (fast DRAM) device and/or a fast static random access memory (fast SRAM) device which acts as a working memory for improving an operation of the controller 1110.

The electronic system 1100 may be applied to a personal digital assistant (PDA), a portable computer, a web tablet, a wireless phone, a mobile phone, a digital music player, a memory card, or other electronic products receiving and/or transmitting information data by wireless.

Figure 15:
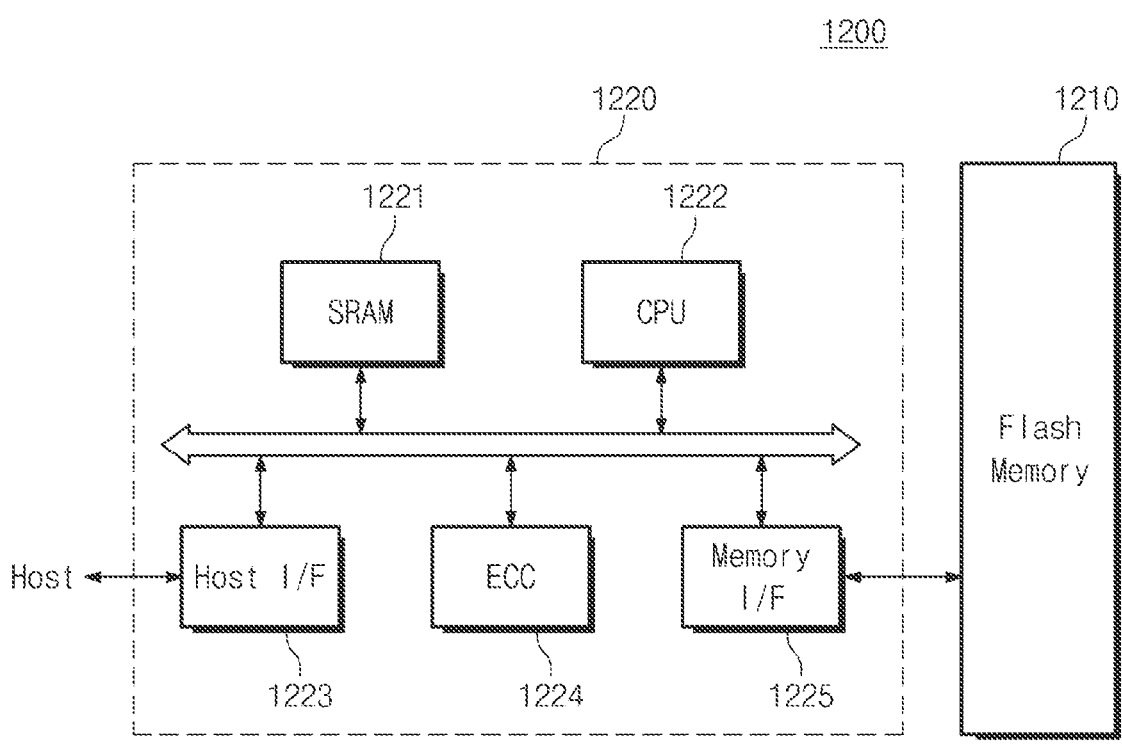
FIG. 15 is a schematic block diagram illustrating an example of a memory card including a semiconductor device according to example embodiments of inventive concepts.

FIG. 15 is a schematic block diagram illustrating an example of a memory card including a semiconductor device according to example embodiments of inventive concepts.

Referring to FIG. 15, a memory card 1200 includes a memory device 1210. The memory device 1210 may include at least one of the semiconductor devices of the aforementioned example embodiments of inventive concepts. In addition, the memory device 1210 may further include another type of a semiconductor memory device (e.g., a DRAM device and/or a SRAM device). The memory card 1200 may include a memory controller 1220 that controls data communication between a host and the memory device 1210.

The memory controller 1220 may include a central processing unit (CPU) 1222 that controls overall operations of the memory card 1200. In addition, the memory controller 1220 may include an SRAM device 1221 used as a working memory of the CPU 1222. Moreover, the memory controller 1220 may further include a host interface unit 1223 and a memory interface unit 1225. The host interface unit 1223 may include a data communication protocol between the memory card 1200 and the host. The memory interface unit 1225 may connect the memory controller 1220 to the memory device 1210. Furthermore, the memory controller 1220 may further include an error check and correction (ECC) block 1224. The ECC block 1224 may detect and correct errors of data which are read out from the memory device 1210. Even though not shown in the drawings, the memory card 1200 may further include a read only memory (ROM) device that stores code data to interface with the host. The memory card 1200 may be used as a portable data storage card. Alternatively, the memory card 1200 may be realized as solid state disks (SSD) which are used as hard disks of computer systems.

Figure 16:
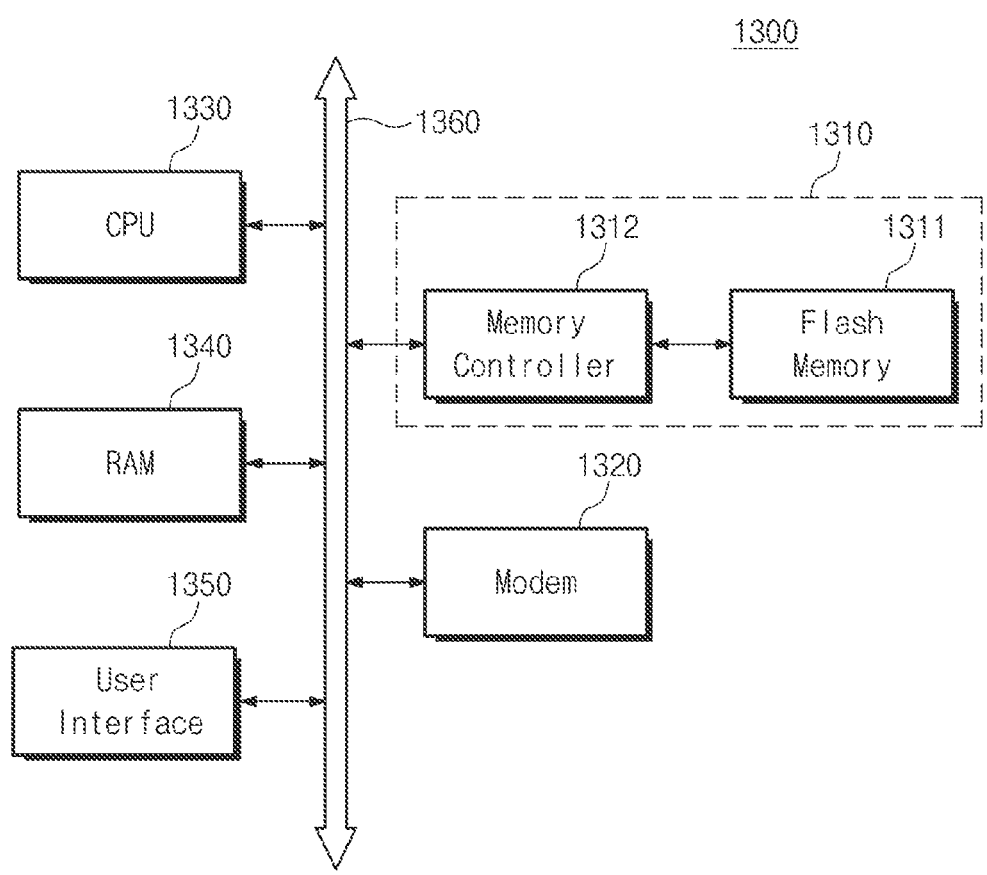
FIG. 16 is a schematic block diagram illustrating an example of an information processing system including a semiconductor device according to example embodiments of inventive concepts.

FIG. 16 is a schematic block diagram illustrating an example of an information processing system including a semiconductor device according to example embodiments of inventive concepts.

Referring to FIG. 16, a flash memory system 1310 may be installed in an information processing system 1300 such as a mobile device or a desk top computer. The flash memory system 1310 may include a flash memory device 1311 and a memory controller 1312. The flash memory device 1311 may include at least one of the semiconductor devices according to the above mentioned example embodiments of inventive concepts. The information processing system 1300 may include a modem 1320, a central processing unit (CPU) 1330, a random access memory (RAM) 1340, and a user interface unit 1350 which are electrically connected to the flash memory system 1310 through a system bus 1360. The flash memory system 1310 may store data processed by the CPU 1330 or data inputted from an external system. In example embodiments, the flash memory system 1310 may be realized as a solid state disk (SSD). In this case, the information processing system 1300 may stably store massive data into the flash memory system 1310. In addition, as reliability of the flash memory system 1310 increases, the flash memory system 1310 may reduce a resource consumed for correcting errors. Thus, the flash memory system 1310 may provide a fast data communication function to the information processing system 1300. Even though not shown in the drawings, the information processing system 1300 may further include an application chipset, a camera image processor (CIS), and/or an input/output unit.

According to example embodiments of inventive concepts, since over-etching for stable contact may not be performed, it is possible to limit and/or prevent the conductive pattern from being penetrated by the contact hole.

According to example embodiments of inventive concepts, the residue remaining on the electrodes disposed at different levels may be removed by the wet etching process in the 3D semiconductor device, so the contact plugs may be in stable contact with the electrodes.

It should be understood that example embodiments described herein should be considered in a descriptive sense only and not for purposes of limitation. Descriptions of features or aspects within each device or method according to example embodiments should typically be considered as available for other similar features or aspects in other devices or methods according to example embodiments. While some example embodiments have been particularly shown and described, it will be understood by one of ordinary skill in the art that variations in form and detail may be made therein without departing from the spirit and scope of the claims.

What is claimed is:

1. A semiconductor device comprising:
a stack structure on a substrate, the stack structure including a plurality of conductive patterns stacked on the substrate;
a vertical channel structure penetrating the plurality of conductive patterns and connecting the substrate; and
a plurality of contact plugs connected to the plurality of conductive patterns respectively,
wherein at least one of the plurality of contact plugs includes a contact plate inside a corresponding one of the plurality of conductive patterns and a contact body on the contact plate.

2. The semiconductor device of claim 1, wherein each of the plurality of conductive patterns includes an end portion, the end portions of the plurality of conductive patterns defining a stepwise structure, and
wherein the contact plate is in the end portion of the corresponding one of the plurality of conductive patterns.

3. The semiconductor device of claim 2, further comprising:
an interlayer insulating layer covering the stepwise structure,
wherein the contact body penetrates the interlayer insulating layer.

4. The semiconductor device of claim 2,
wherein the stack structure further includes a plurality of insulating patterns, the plurality of insulating patterns and the plurality of conductive patterns being alternatively stacked on the substrate, and
wherein the contact body penetrates a corresponding one of the plurality of insulating patterns.

5. The semiconductor device of claim 1, wherein the contact plate penetrates the corresponding one of the plurality of conductive patterns.

6. The semiconductor device of claim 1, wherein a width of the contact plate is greater than a width of a bottom of the contact body.

7. The semiconductor device of claim 1, wherein a level of a top surface of the contact plate is lower than a level of a top surface of the corresponding one of the plurality of conductive patterns.

8. The semiconductor device of claim 1, further comprising:
a barrier layer between the contact plate and the corresponding one of the plurality of conductive patterns, wherein the barrier layer extends on a surface of the contact body.

9. The semiconductor device of claim 1, wherein the corresponding one of the plurality of conductive patterns is a lowest one of the plurality of conductive patterns.

10. A semiconductor device comprising:
a stack structure on a substrate, the stack structure including a plurality of conductive patterns stacked on the substrate;
a plurality of contact plugs connected to the plurality of conductive patterns respectively;
an insulating layer covering the plurality of contact plugs; and
a barrier layer between the plurality of contact plugs and the insulating layer,
wherein at least one of the plurality of contact plugs includes a contact plate inside a corresponding one of the plurality of conductive patterns and a contact body on the contact plate, and
wherein a level of a bottom surface of the contact plate is substantially lower than a level of a top surface of the corresponding one of the plurality of conductive patterns, and
wherein the barrier layer is between the contact plate and the corresponding one of the plurality of conductive patterns.

11. The semiconductor device of claim 10, wherein the bottom surface of the contact plate is substantially parallel to a top surface of the substrate.

12. The semiconductor device of claim 10, wherein a level of a top surface of the contact plate is lower than a level of the top surface of the corresponding one of the plurality of conductive patterns.

13. The semiconductor device of claim 10, wherein each of the plurality of conductive patterns includes an end portion, the end portions of the plurality of conductive patterns defining a stepwise structure, and
wherein the contact plate is in the end portion of the corresponding one of the plurality of conductive patterns.

14. The semiconductor device of claim 13, wherein the stack structure further includes a plurality of insulating patterns, the plurality of insulating patterns and the plurality of conductive patterns being alternatively stacked on the substrate, and
wherein the contact body penetrates a corresponding one of the plurality of insulating patterns.

15. A semiconductor device comprising:
a stack structure on a substrate,
the stack structure including a plurality of electrodes sequentially stacked on the substrate,
each of the plurality of electrodes including an end portion,
the end portions of the plurality of electrodes defining a stepwise structure;
an insulating layer covering the stepwise structure;
a vertical channel structure penetrating the plurality of electrodes; and
a plurality of contact plugs being plugged in the end portions of the plurality of electrodes respectively,
wherein at least one of the plurality of contact plugs includes a contact plate inside the end portion of a corresponding one of the plurality of electrodes and a contact body on the contact plate and penetrating the insulation layer, and
wherein a width of the contact plate is greater than a width of a top surface of the contact body.

16. The semiconductor device of claim 15, wherein the contact plate penetrates the end portion of the corresponding one of the plurality of electrodes.

17. The semiconductor device of claim 15, wherein a bottom surface of the contact plate is substantially parallel with a top surface of the substrate.

18. The semiconductor device of claim 15, wherein a level of a bottom surface of the contact plate is substantially lower than a level of a top surface of the corresponding one of the plurality of electrodes.

19. The semiconductor device of claim 15, further comprising:
a barrier layer between the contact plate and the end portion of the corresponding one of the plurality of electrodes, wherein the barrier layer extends between the contact body and the insulation layer.

20. The semiconductor device of claim 15, wherein the contact plate has a circular shape in a plan view.

* * * * *